(12) United States Patent
Cho et al.

(10) Patent No.: US 12,356,625 B2
(45) Date of Patent: Jul. 8, 2025

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Min Hee Cho, Suwon-si (KR); Dong Il Bae, Seongnam-si (KR); Won Sok Lee, Suwon-si (KR); Yong Seok Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 571 days.

(21) Appl. No.: 17/846,158

(22) Filed: Jun. 22, 2022

(65) Prior Publication Data

US 2023/0147083 A1 May 11, 2023

(30) Foreign Application Priority Data

Nov. 9, 2021 (KR) ........................ 10-2021-0152989

(51) Int. Cl.
| | |
|---|---|
| *H10B 43/40* | (2023.01) |
| *H10B 41/10* | (2023.01) |
| *H10B 41/27* | (2023.01) |
| *H10B 41/40* | (2023.01) |
| *H10B 43/10* | (2023.01) |
| *H10B 43/27* | (2023.01) |

(52) U.S. Cl.
CPC ............ *H10B 43/40* (2023.02); *H10B 41/10* (2023.02); *H10B 41/27* (2023.02); *H10B 41/40* (2023.02); *H10B 43/10* (2023.02); *H10B 43/27* (2023.02)

(58) Field of Classification Search
CPC ...... H10B 12/20; H10B 12/31; H10B 12/315; H10B 12/318; H10B 41/10; H10B 41/27; H10B 41/40; H10B 43/10; H10B 43/27; H10B 43/40
See application file for complete search history.

(56) References Cited

U.S. PATENT DOCUMENTS

| | | | |
|---|---|---|---|
| 7,776,715 B2 | 8/2010 | Wells et al. |
| 7,863,748 B2 | 1/2011 | Oh et al. |
| 8,455,978 B2 | 6/2013 | Lee |
| 9,111,960 B2 | 8/2015 | Kim et al. |
| 10,916,548 B1 | 2/2021 | Derner et al. |
| 10,998,316 B2 | 5/2021 | Lee |
| 11,049,804 B2 | 6/2021 | Ramaswamy |
| 11,062,751 B2 | 7/2021 | Cho et al. |
| 11,101,318 B2 | 8/2021 | Kumar et al. |

(Continued)

*Primary Examiner* — Brook Kebede
(74) *Attorney, Agent, or Firm* — Myers Bigel, P.A.

(57) ABSTRACT

A semiconductor memory device includes a cell area and a peripheral area, a base insulating layer including opposed first front and rear surfaces in the cell area, a first semiconductor substrate including opposed second front and rear surfaces in the peripheral area, an active pattern on the first front surface, a first conductive line extending in a first direction on a side of the active pattern, a capacitor structure on the active pattern, a first circuit element on the second front surface, and a second conductive line extending in a second direction intersecting the first direction on the first rear surface and the second rear surface. The active pattern extends in a vertical direction intersecting the first direction and the second direction to electrically connect the second conductive line to the capacitor structure.

20 Claims, 27 Drawing Sheets

(56) References Cited

U.S. PATENT DOCUMENTS

| | | | |
|---|---|---|---|
| 2011/0183488 A1* | 7/2011 | Takaishi | H10B 12/053 |
| | | | 438/675 |
| 2014/0210087 A1* | 7/2014 | Kang | H01L 23/532 |
| | | | 257/774 |
| 2017/0018552 A1* | 1/2017 | Moon | H01L 21/76232 |
| 2021/0005611 A1 | 1/2021 | Sukekawa et al. | |
| 2021/0217447 A1* | 7/2021 | Kim | H10B 12/053 |
| 2021/0249416 A1 | 8/2021 | Li et al. | |
| 2021/0375896 A1* | 12/2021 | Kim | H10B 41/10 |

* cited by examiner

SEMICONDUCTOR MEMORY DEVICE AND METHOD FOR FABRICATING THE SAME

CROSS-REFERENCE TO RELATED APPLICATION

This application claims priority from Korean Patent Application No. 10-2021-0152989 filed on Nov. 9, 2021 in the Korean Intellectual Property Office and all the benefits accruing therefrom under 35 U.S.C. 119, the contents of which in its entirety are herein incorporated by reference.

FIELD

The present disclosure relates to a semiconductor memory device and a method for fabricating the same. More particularly, the present disclosure relates to a semiconductor memory device including a vertical channel transistor (VCT) and a method for fabricating the same.

BACKGROUND

A semiconductor memory device having an improved degree of integration may be desired to provide improved performance and reduced cost to meet consumer demand. In a semiconductor memory device, since the degree of integration may be a factor in the price of a product, a high degree of integration may be desired.

In a two-dimensional or planar semiconductor memory device, since the degree of integration may be determined by an area occupied by a unit memory cell, it may be greatly affected by the level of the technology for forming fine patterns. However, since expensive equipment may be required for the fine patterns, the degree of integration of the two-dimensional semiconductor memory device, while increasing, may still be restricted. Therefore, semiconductor memory devices including vertical channel transistors in which a channel extends in a vertical direction have been proposed.

SUMMARY

Embodiments of the present disclosure provide a semiconductor memory device having improved performance and degree of integration.

Embodiments of the present disclosure also provide a method for fabricating a semiconductor memory device having improved performance and degree of integration.

The embodiments of the present disclosure are not limited to those mentioned above and additional objects of the present disclosure, which are not mentioned herein, will be clearly understood by those skilled in the art from the following description of the present disclosure.

According to an aspect of the present inventive concept, there is provided a semiconductor memory device comprising a cell area and a peripheral area adjacent the cell area, a base insulating layer including a first front surface and a first rear surface, which are opposite to each other, in the cell area, a first semiconductor substrate including a second front surface and a second rear surface, which are opposite to each other, in the peripheral area, an active pattern on the first front surface of the base insulating layer, a first conductive line extending in a first direction on a side of the active pattern, a capacitor structure on the active pattern, a first circuit element on the second front surface of the first semiconductor substrate, and a second conductive line extending in a second direction intersecting the first direction on the first rear surface of the base insulating layer and the second rear surface of the first semiconductor substrate, wherein the active pattern extends in a vertical direction intersecting the first direction and the second direction to electrically connect the second conductive line to the capacitor structure.

According to an aspect of the present inventive concept, there is provided a semiconductor memory device comprising an insulating structure including a first surface and a second surface, which are opposite to each other, an active pattern on the first surface of the insulating structure, a first conductive line extending in a first direction on a side of the active pattern, a capacitor structure on the active pattern, a second conductive line extending in a second direction intersecting the first direction in the insulating structure, a first semiconductor substrate including a first rear surface facing the second surface of the insulating structure and a first front surface opposite to the first rear surface, and a first circuit element on the first front surface of the first semiconductor substrate, wherein the active pattern extends in a vertical direction intersecting the first direction and the second direction to electrically connect the second conductive line to the capacitor structure.

According to an aspect of the present inventive concept, there is provided a semiconductor memory device comprising a base insulating layer including a first front surface and a first rear surface, which are opposite to each other, an active pattern on the first front surface of the base insulating layer, a first conductive line extending in a first direction on a side of the active pattern, a capacitor structure on the active pattern, a plurality of second conductive lines spaced apart from each other on the first rear surface of the base insulating layer and extending in parallel in a second direction intersecting the first direction, a bit line contact electrically connecting one of the second conductive lines to the active pattern and extending through the base insulating layer, and a shielding line between two adjacent second conductive lines among the plurality of second conductive lines on the first rear surface of the base insulating layer, wherein the active pattern extends in a vertical direction intersecting the first direction and the second direction to electrically connect the bit line contact to the capacitor structure.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Hereinafter, a semiconductor memory device according to example embodiments will be described with reference to FIGS. 1 to 10.

Figure 1:
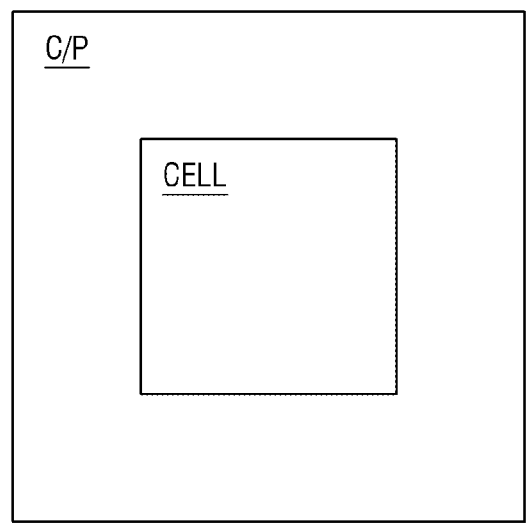
FIG. 1 is an example layout view illustrating a semiconductor memory device according to some embodiments.
Figure 2:
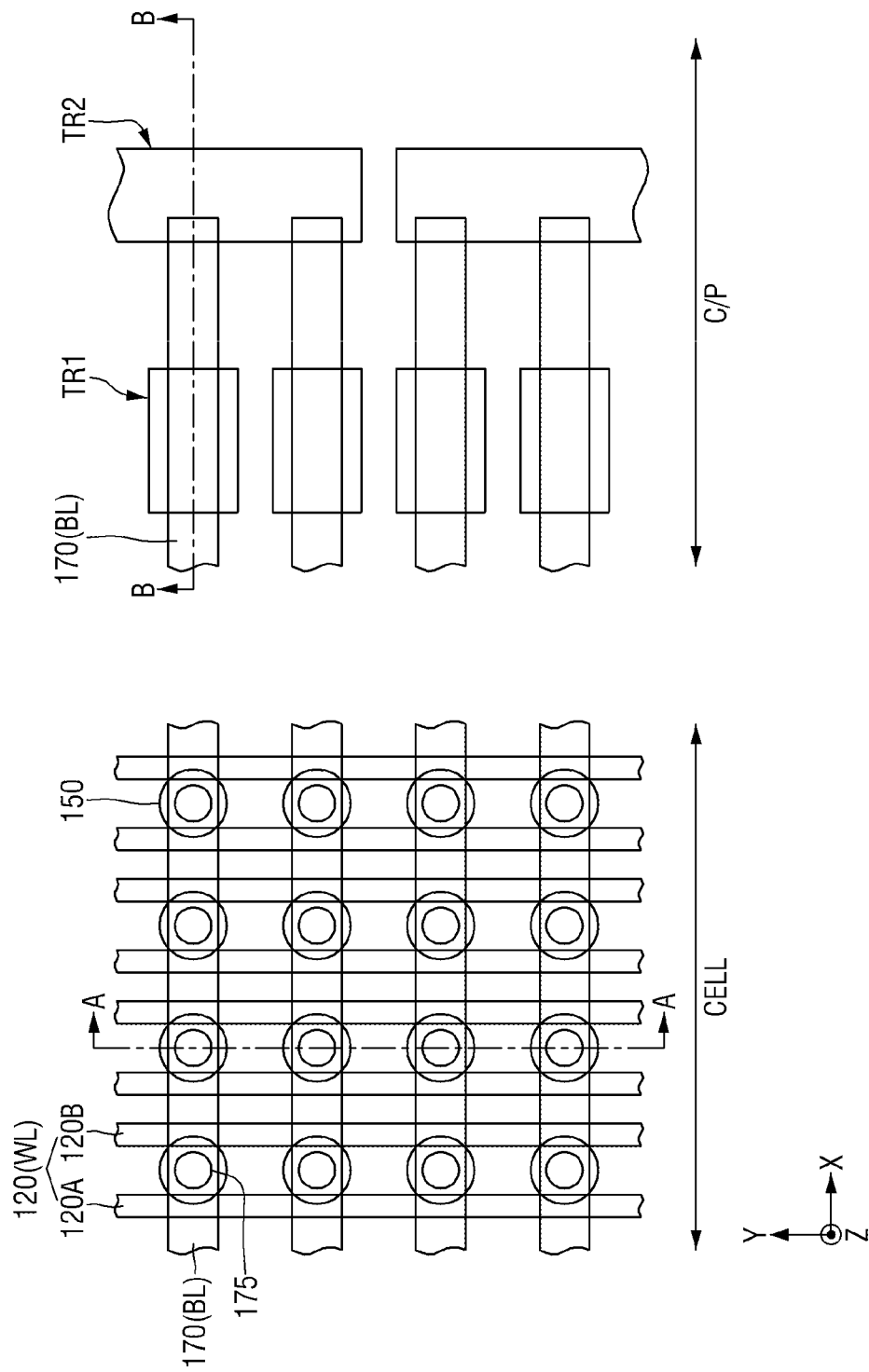
FIG. 2 illustrates partial layouts of a cell area and a core/peri area of FIG. 1.
Figure 3:
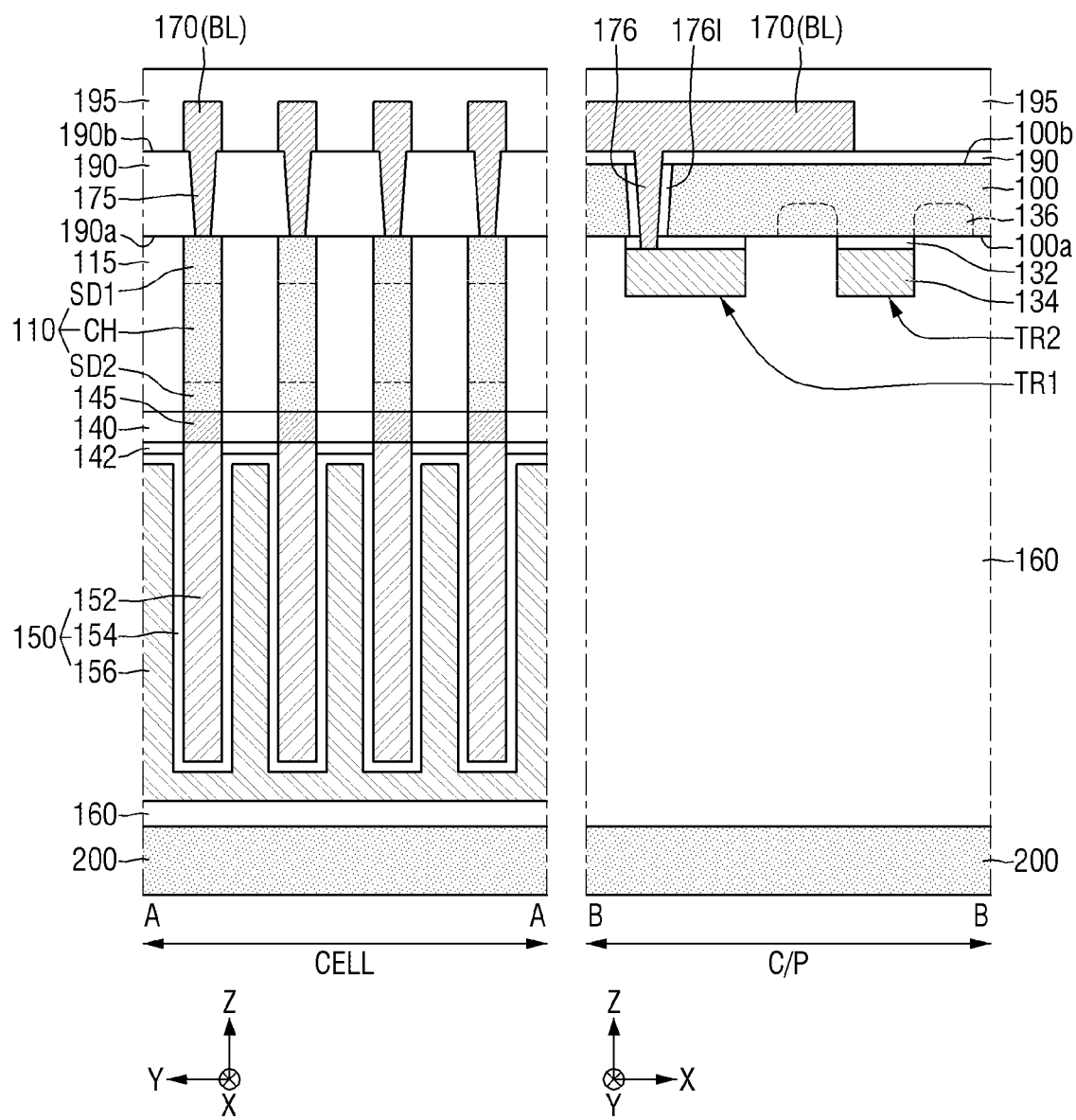
FIG. 3 illustrates cross-sections taken along lines A-A and B-B of FIG. 2.
Figure 4:
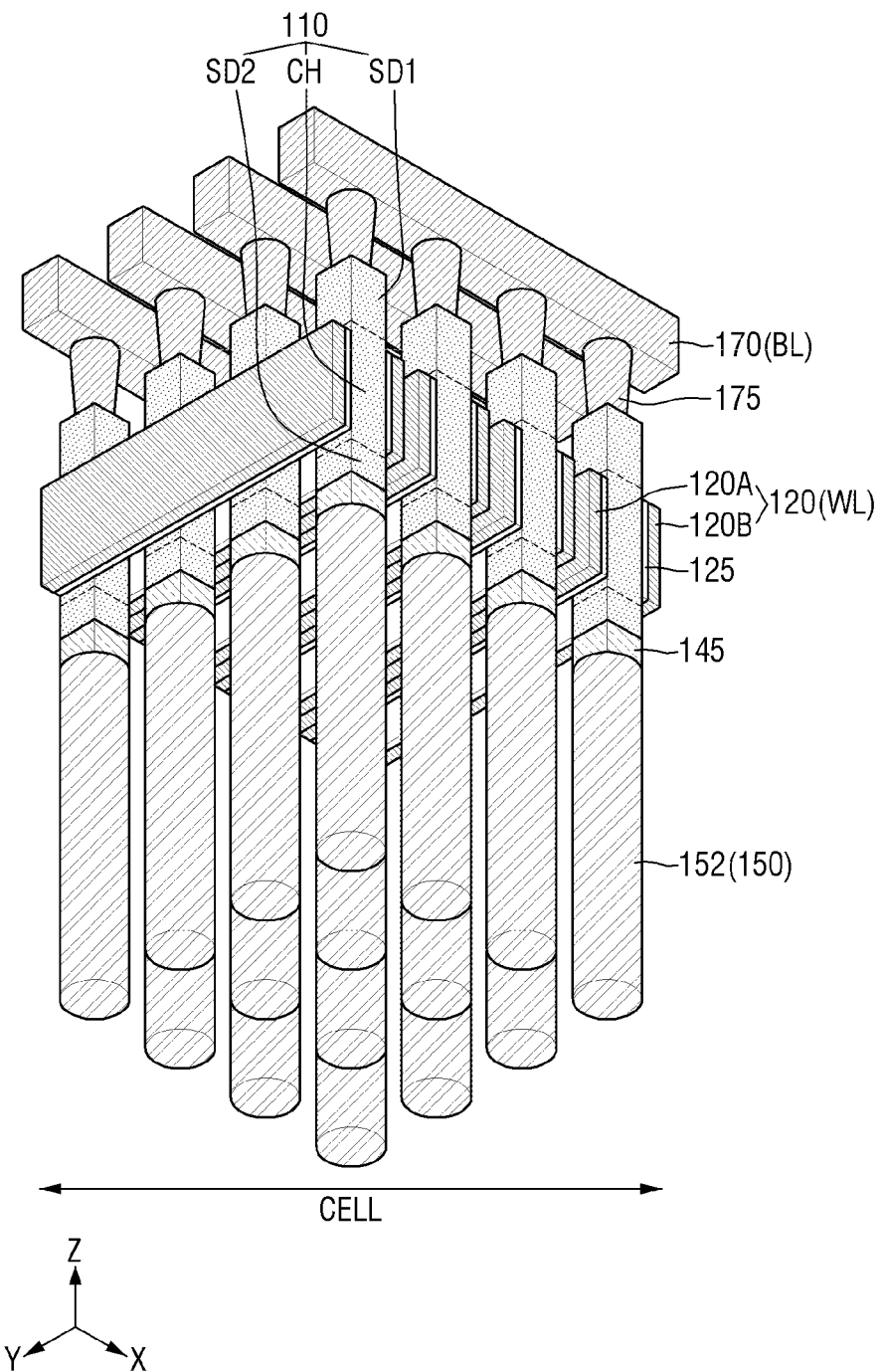
FIG. 4 is a partial perspective view illustrating a cell area of FIG. 3.

FIG. 1 is an example layout view illustrating a semiconductor memory device according to some embodiments. FIG. 2 illustrates partial layouts of a cell area and a core/peri area of FIG. 1. FIG. 3 illustrates cross-sections taken along lines A-A and B-B of FIG. 2. FIG. 4 is a partial perspective view illustrating a cell area of FIG. 3.

Referring to FIG. 1, the semiconductor memory device according to some embodiments includes a cell area CELL and a peripheral area C/P.

An active pattern 110, a word line WL, a bit line BL, a bit line contact 175, a capacitor structure 150, and a capacitor contact 145, which will be described later, may be formed in the cell area CELL. Therefore, a plurality of semiconductor memory devices may be implemented in the cell area CELL.

The peripheral area C/P may be disposed near or adjacent the cell area CELL. For example, the peripheral area C/P may surround the cell area CELL. Control elements, such as a first circuit element TR1 and a second circuit element TR2, which will be described later, and dummy elements (not shown) may be formed in the peripheral area C/P. Therefore, the peripheral area C/P may control functions of the semiconductor memory devices implemented in the cell area CELL.

Referring to FIGS. 2 to 4, the semiconductor memory device according to some embodiments includes a base insulating layer 190, an active pattern 110, a first conductive line 120, a first gate dielectric layer 125, a buried insulating layer 115, a capacitor contact 145, a first front insulating layer 140, a capacitor structure 150, a first semiconductor substrate 100, a first circuit element TR1, a second circuit element TR2, a second front insulating layer 160, a second semiconductor substrate 200, a second conductive line 170, a bit line contact 175, and a first rear insulating layer 195.

The base insulating layer 190 may be disposed in the cell area CELL. The base insulating layer 190 may include a first front surface 190a and a first rear surface 190b, which are opposite to each other. The base insulating layer 190 may include, but is not limited to, silicon oxide, silicon oxynitride, a low-k material having a dielectric constant lower than that of silicon oxide, or their combination.

The active pattern 110 may be formed on the first front surface 190a of the base insulating layer 190. The plurality of active patterns 110 may be spaced apart from each other on the base insulating layer 190. In some embodiments, the active patterns 110 may be arranged in a matrix form in a first direction Y and a second direction X.

Each of the active patterns 110 may extend in a vertical direction (hereinafter, referred to as third direction Z) crossing or intersecting the first direction Y and the second direction X. For example, a height of the active pattern 110 extending in the third direction Z may be greater than a width of the active pattern 110 (e.g., width in the first direction Y or width in the second direction X). The height of the active pattern 110 may be about two (2) times to about ten (10) times of the width of the active pattern 110, but is not limited thereto.

The semiconductor memory device according to some embodiments may be a memory device that includes a vertical channel transistor (VCT). The vertical channel transistor may refer to a structure in which a channel length of a channel layer extends in the vertical direction (e.g., third direction Z). For example, the active pattern 110 may include a first source/drain area SD1, a channel area CH, and a second source/drain area SD2, which are arranged along the third direction Z. The channel area CH may be interposed between the first source/drain area SD1 and the second source/drain area SD2 to serve as a channel area of the vertical channel transistor.

The active pattern 110 may include a semiconductor material. For example, the active pattern 110 may include silicon, silicon germanium, silicon germanium on insulator (SGOI), indium antimonide, lead telluride compound, indium arsenide, indium phosphide, gallium arsenide or gallium antimonide. The active pattern 110 may include a single layer or a multi-layer of the semiconductor material. In some embodiments, the active pattern 110 may include a single crystal semiconductor material. For example, the active pattern 110 may include single crystal silicon.

The first conductive line 120 may extend in the first direction Y on a side of the active pattern 110. The plurality of first conductive lines 120 may be spaced apart from each other in the second direction X and may extend in the first direction Y, respectively. Each of the first conductive lines 120 may serve as the word line WL of the semiconductor memory device according to some embodiments.

The first conductive line 120 may include, for example, doped polysilicon, metal, conductive metal nitride, conductive metal silicide, conductive metal oxide, or their combination. For example, the first conductive line 120 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or their combination.

In some embodiments, the first conductive line 120 may include a first gate electrode 120A and a second gate electrode 120B. The first gate electrode 120A may face a first side of the active pattern 110, and the second gate electrode 120B may face a second side of the active pattern 110 opposite to the first side. As one active pattern 110 is interposed between the first gate electrode 120A and the second gate electrode 120B, the word line WL of the semiconductor memory device according to some embodiments may be provided as a dual-gate transistor.

The first gate dielectric layer 125 may be interposed between the active pattern 110 and the first conductive line 120. For example, the first gate dielectric layer 125 may extend in the first direction Y in which the first conductive line 120 extends. The sides (e.g., the first side and the second side) of the active pattern 110 facing the first conductive line 120 may be in contact with the first gate dielectric layer 125.

The first gate dielectric layer 125 may include, for example, silicon oxide, silicon oxynitride, and a high-k material having a dielectric constant higher than that of silicon oxide, or their combination. The high-k material may be made of metal oxide or metal oxynitride. For example, the first gate dielectric layer 125 may be made of HfO$_2$, HfSiO, HfSiON, HfTaO, HfTiO, HfZrO, ZrO2, Al$_2$O$_3$ or their combination, but is not limited thereto.

The buried insulating layer 115 may be formed on the first front surface 190a of the base insulating layer 190. The buried insulating layer 115 may be formed to fill a space between the active patterns 110 adjacent to each other and between the first conductive lines 120 adjacent to each other. The plurality of active patterns 110 and the plurality of first conductive lines 120 may be electrically spaced apart from each other by the buried insulating layer 115.

The buried insulating layer 115 may include, but is not limited to, silicon oxide, silicon oxynitride, and a low-k material having a dielectric constant lower than that of silicon oxide, or their combination.

The capacitor contact 145 may be formed on the active pattern 110 (e.g., on a lower surface of the active pattern 110 of FIG. 3). The capacitor contact 145 may be connected to the second source/drain area SD2 of the active pattern 110. In some embodiments, the capacitor contact 145 may be disposed to overlap the active pattern 110 in the third direction Z. For example, the plurality of capacitor contacts 145 may be arranged in the form of a matrix corresponding to the plurality of active patterns 110.

The capacitor contact 145 may include, for example, doped polysilicon, metal, conductive metal nitride, conductive metal silicide, conductive metal oxide, or their combination. For example, the capacitor contact 145 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or their combination, but is not limited thereto.

The first front insulating layer 140 may be formed on the buried insulating layer 115 (e.g., on a lower surface of the buried insulating layer 115 of FIG. 3). The first front insulating layer 140 may surround a side of the capacitor contact 145. The plurality of capacitor contacts 145 may be electrically spaced apart from each other by the first front insulating layer 140.

The first front insulating layer 140 may include, for example, silicon oxide, silicon oxynitride, a low-k material having a dielectric constant lower than that of the silicon oxide, or their combination, but is not limited thereto.

The capacitor structure 150 may be formed on the capacitor contact 145 and the first front insulating layer 140 (e.g., on a lower surface of the capacitor contact 145 of FIG. 3 and a lower surface of the first front insulating layer 140 of FIG. 3). In some embodiments, a liner layer 142 may be interposed between the first front insulating layer 140 and the capacitor structure 150. The liner layer 142 may serve as an etch stop layer in an etching process for forming the capacitor structure 150.

The capacitor structure 150 may include a first electrode 152, a capacitor dielectric layer 154, and a second electrode 156, which are sequentially stacked. The capacitor structure 150 may store data (e.g., charges) in the capacitor dielectric layer 154 by using a potential difference generated between the first electrode 152 and the second electrode 156.

The first electrode 152 may be connected to the capacitor contact 145 through the liner layer 142. The first electrode 152 may be connected to the active pattern 110 through the capacitor contact 145. The first electrode 152 may be in the form of a pillar extending in the third direction Z, for example, but is not limited thereto. As another example, the first electrode 152 may be in the form of a cylinder extending in the third direction Z. In some embodiments, the first electrode 152 may be disposed to overlap the capacitor contact 145 in the third direction Z. For example, the plurality of first electrodes 152 may be arranged in the form of a matrix corresponding to the plurality of capacitor contacts 145. The first electrode 152 may include, for example, doped polysilicon, metal, conductive metal nitride, conductive metal silicide, conductive metal oxide, or their combination, but is not limited thereto.

The capacitor dielectric layer 154 may be stacked on the first electrode 152. For example, the capacitor dielectric layer 154 may extend to be conformal along a profile of a surface of the first electrode 152. The capacitor dielectric layer 154 may include, for example, silicon oxide, silicon oxynitride, and a high-k material having a dielectric constant higher than that of the silicon oxide, or their combination, but is not limited thereto. The capacitor dielectric layer 154 may include a single layer or a multi-layer of the dielectric material.

The second electrode 156 may be stacked on the capacitor dielectric layer 154. Therefore, the capacitor dielectric layer 154 may be interposed between the first electrode 152 and the second electrode 156. The second electrode 156 may include, for example, doped polysilicon, metal, conductive metal nitride, conductive metal silicide, conductive metal oxide, or their combination, but is not limited thereto.

The first semiconductor substrate 100 may be disposed in the peripheral area C/P. The first semiconductor substrate 100 may include a second front surface 100a and a second rear surface 100b, which are opposite to each other. The first semiconductor substrate 100 may be adjacent to the base insulating layer 190 in a lateral direction. For example, at least a portion of the first semiconductor substrate 100 may overlap the base insulating layer 190 in the first direction Y or the second direction X. Although the second front surface 100a of the first semiconductor substrate 100 is shown as being disposed on the first front surface 190a and a coplanar surface of the base insulating layer 190, this is only by way of example, and the second front surface 100a of the first semiconductor substrate 100 may be formed to be higher or lower than the first front surface 190a of the base insulating layer 190.

The first semiconductor substrate 100 may be a bulk silicon or a silicon-on-insulator (SOI). The first semiconductor substrate 100 may be a silicon substrate, or may include other materials such as silicon germanium, silicon germanium on insulator (SGOI), indium antimonide, lead telluride compound, indium arsenide, indium phosphide, gallium arsenide or gallium antimonide. In some embodiments, the first semiconductor substrate 100 may include a single crystal semiconductor material. For example, the first semiconductor substrate 100 may include single crystal silicon. In some embodiments, the first semiconductor substrate 100 and the active pattern 110 may include the same material, or may have the same material composition.

The first circuit element TR1 and the second circuit element TR2 may be formed on the second front surface 100a of the first semiconductor substrate 100. The first circuit element TR1 and the second circuit element TR2 may be control elements that control functions of the semiconductor memory devices implemented in the cell area CELL. For example, each of the first and second circuit elements TR1 and TR2 may include a column decoder, a row decoder, a sense amplifier SA, or a sub word line driver SWL of the semiconductor memory device according to some embodiments.

In some embodiments, each of the first and second circuit elements TR1 and TR2 may be a transistor that uses a portion of the first semiconductor substrate 100 as a channel layer. For example, each of the first and second circuit elements TR1 and TR2 may include a second gate dielectric layer 132, a third gate electrode 134, and a third source/drain area 136. The third gate electrode 134 may extend along the second front surface 100a of the first semiconductor substrate 100. The second gate dielectric layer 132 may be interposed between the first semiconductor substrate 100 and the third gate electrode 134. The third source/drain area 136 may be formed in the first semiconductor substrate 100 on a side of the third gate electrode 134.

The second front insulating layer 160 may be formed on the first front surface 190a of the base insulating layer 190 and the second front surface 100a of the first semiconductor substrate 100. The second front insulating layer 160 may cover the capacitor structure 150 formed in the cell area CELL and the first and second circuit elements TR1 and TR2 formed in the peripheral area C/P.

The second front insulating layer 160 may include, but is not limited to, silicon oxide, silicon oxynitride, a low-k material having a dielectric constant lower than that of the silicon oxide, or their combination.

The second semiconductor substrate 200 may be disposed on the second front insulating layer 160 (e.g., on a lower surface of the second front insulating layer 160 of FIG. 3). The second semiconductor substrate 200 may be provided as a handling substrate (e.g., wafer) for forming the second conductive line 170, the bit line contact 175, a first through via 176, and the first rear insulating layer 195. This will be described in more detail with reference to FIGS. 10 to 18. In some other embodiments, the second semiconductor substrate 200 may be removed.

The second conductive line 170 may extend in the second direction X on the first rear surface 190b of the base insulating layer 190. The plurality of second conductive lines 170 may be spaced apart from each other in the first direction Y and extending in the second direction X, respectively. Each of the second conductive lines 170 may serve as a bit line BL of the semiconductor memory device according to some embodiments.

The second conductive line 170 may include, for example, doped polysilicon, metal, conductive metal nitride, conductive metal silicide, conductive metal oxide, or their combination. For example, the second conductive line 170 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or their combination.

The bit line contact 175 may be formed on the active pattern 110 (e.g., on an upper surface of the active pattern 110 of FIG. 3). The bit line contact 175 may connect the second conductive line 170 with the active pattern 110. For example, the bit line contact 175 may connect the second conductive line 170 with the first source/drain area SD1 by passing through the base insulating layer 190. Therefore, the active pattern 110 may electrically connect the second conductive line 170 with the capacitor structure 150.

In some embodiments, a width of the bit line contact 175 (e.g., width in the first direction Y or width in the second direction X) may be reduced as the bit line contact 175 becomes adjacent to the active pattern 110. This may be caused by characteristics of an etching process for forming the bit line contact 175. For example, the etching process for forming the bit line contact 175 may be performed on the first rear surface 190b of the base insulating layer 190.

In some embodiments, the bit line contact 175 may be disposed to overlap the active pattern 110 in the third direction Z. For example, the plurality of bit line contacts 175 may be arranged in the form of a matrix corresponding to the plurality of active patterns 110. In some embodiments, the plurality of bit line contacts 175 arranged along the second direction X may be connected to one second conductive line 170 extending in the second direction X.

The bit line contact 175 may include, for example, doped polysilicon, metal, conductive metal nitride, conductive metal silicide, conductive metal oxide, or their combination. For example, the bit line contact 175 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or their combination.

In some embodiments, the bit line contact 175 may be formed at the same level as the second conductive line 170. As used herein, the term "same level" means that the corresponding elements are formed by the same fabricating process. For example, the second conductive line 170 and the bit line contact 175 may include the same material, or may have the same material composition In some embodiments, one end of the second conductive line 170 may extend to the peripheral area C/P. For example, one end of the second conductive line 170 extending in the second direction X may be disposed on the second rear surface 100b of the first semiconductor substrate 100 adjacent to the base insulating layer 190.

In some embodiments, a portion of the base insulating layer 190 may be disposed even in the peripheral area C/P. A portion of the base insulating layer 190 disposed in the peripheral area C/P may cover the second rear surface 100b of the first semiconductor substrate 100. The second conductive line 170 may be electrically spaced apart from the first semiconductor substrate 100 by the base insulating layer 190.

In some embodiments, the first circuit element TR1 may be electrically connected to the second conductive line 170.

For example, the first through via 176 for connecting the second conductive line 170 with the third gate electrode 134 of the first circuit element TR1 may be formed in the peripheral area C/P by passing through the base insulating layer 190 and the first semiconductor substrate 100. The first circuit element TR1 may be electrically connected to the second conductive line 170 serving as the bit line BL, whereby the first circuit element TR1 may be provided as a sense amplifier SA of the semiconductor memory device according to some embodiments. In some embodiments, the first circuit element TR1 provided as the sense amplifier SA may be disposed to be adjacent to both ends of the second conductive line 170 extending in the second direction X.

In some embodiments, a first via insulating layer 176l extending along a side of the first through via 176 may be formed in the first semiconductor substrate 100. The first through via 176 may be electrically spaced apart from the first semiconductor substrate 100 by the first via insulating layer 176l.

In some embodiments, the second circuit element TR2 may be provided as another control element except for or different than the sense amplifier SA in the semiconductor memory device according to some embodiments. For example, although not shown in detail, the second circuit element TR2 may be electrically connected to the first conductive line 120 serving as the word line WL. The second circuit element TR2 may be provided as the sub word line driver SWL of the semiconductor memory device according to some embodiments.

The first rear insulating layer 195 may be formed on the first rear surface 190b of the base insulating layer 190 and the second rear surface 100b of the first semiconductor substrate 100. The first rear insulating layer 195 may be formed to fill a space between the second conductive lines 170 adjacent to each other. For example, the first rear insulating layer 195 may cover the base insulating layer 190 and the plurality of second conductive lines 170. The plurality of second conductive lines 170 may be electrically spaced apart from each other by the first rear insulating layer 195.

Although a boundary between the base insulating layer 190 and the first rear insulating layer 195 is shown, this is only by way of example. As the case may be, the boundary between the base insulating layer 190 and the first rear insulating layer 195 may not exist. In the present disclosure, the second conductive line 170 and/or the bit line contact 175 may be disposed in the insulating structures 190 and 195 formed by the base insulating layer 190 and the first rear insulating layer 195.

The first rear insulating layer 195 may include, but is not limited to, silicon oxide, silicon oxynitride, a low-k material having a dielectric constant lower than that of the silicon oxide, or their combination.

Figure 5:
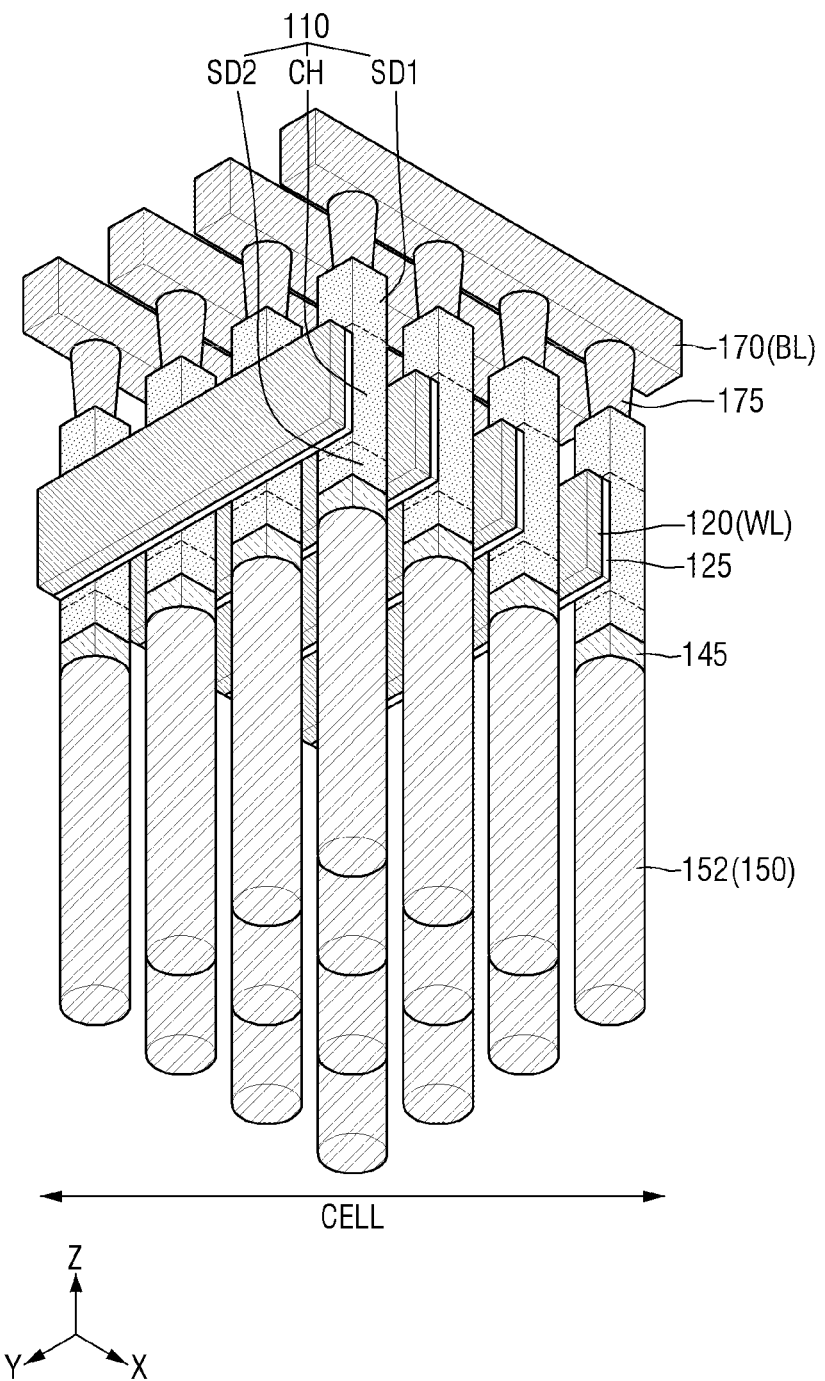
FIG. 5 is a partial perspective view illustrating a semiconductor memory device according to some embodiments.

FIG. 5 is a partial perspective view illustrating a semiconductor memory device according to some embodiments. For convenience of description, portions duplicated with those described with reference to FIGS. 1 to 4 will be described briefly or omitted.

Referring to FIG. 5, the word line WL of the semiconductor memory device according to some embodiments is provided as a single-gate transistor.

For example, the first conductive line 120 may face the first side of the active pattern 110, and may not face the second side of the active pattern 110, which is opposite the first side. A side (e.g., the first side) of the active pattern 110, which faces the first conductive line 120, may be in contact with the first gate dielectric layer 125.

Figure 6:
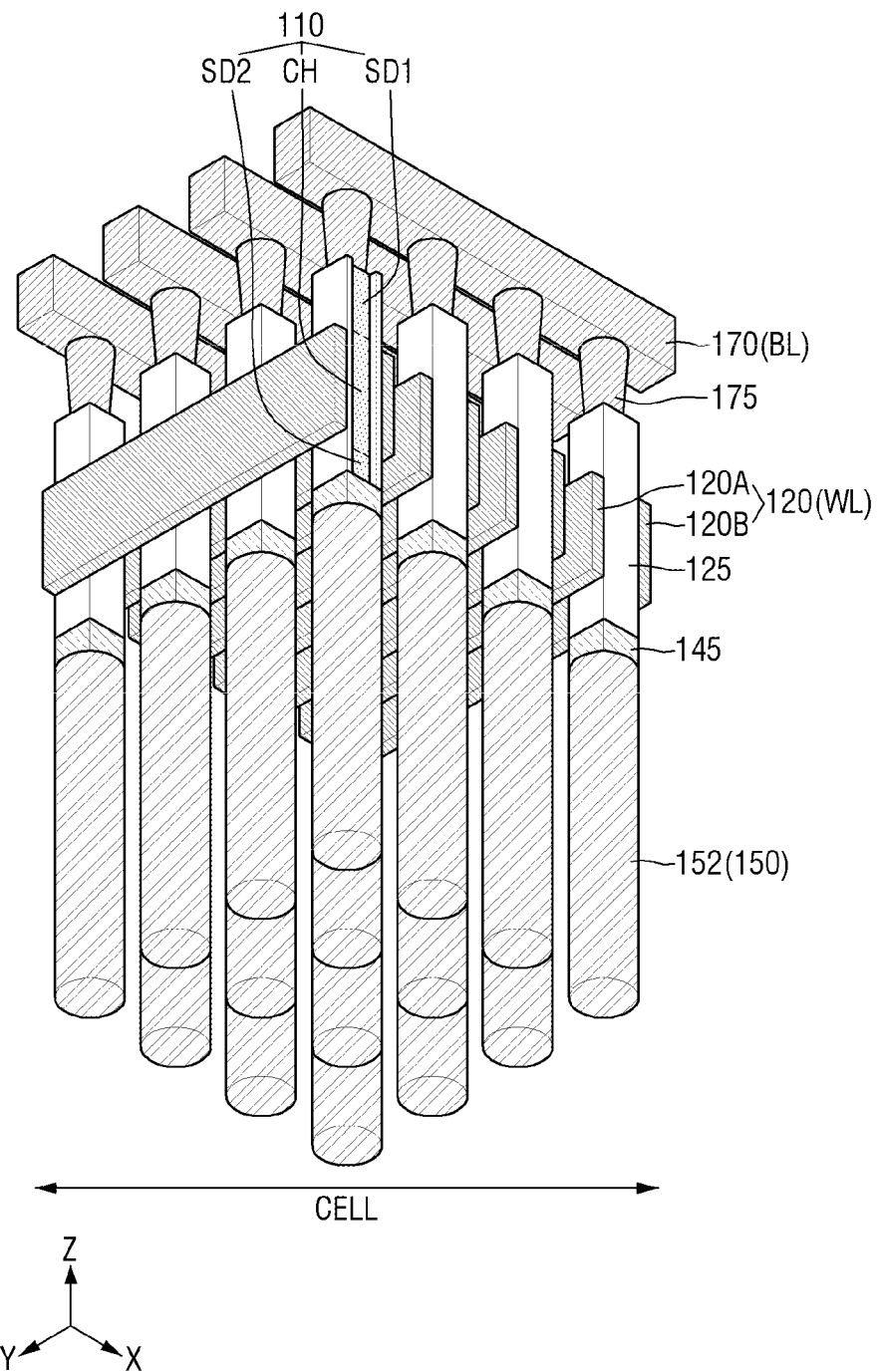
FIG. 6 is a partial perspective view illustrating a semiconductor memory device according to some embodiments.

FIG. 6 is a partial perspective view illustrating a semiconductor memory device according to some embodiments. For convenience of description, portions duplicated with those described with reference to FIGS. 1 to 4 will be described briefly or omitted.

Referring to FIG. 6, in the semiconductor memory device according to some embodiments, the first gate dielectric layer 125 surrounds the side of the active pattern 110.

For example, the entire side of the active pattern 110 may be surrounded by the first gate dielectric layer 125. A portion of the first conductive line 120 extending in the first direction Y may be in contact with a surface of the first gate dielectric layer 125. As a result, a portion of the first gate dielectric layer 125 may be interposed between the active pattern 110 and the first conductive line 120.

Figure 7:
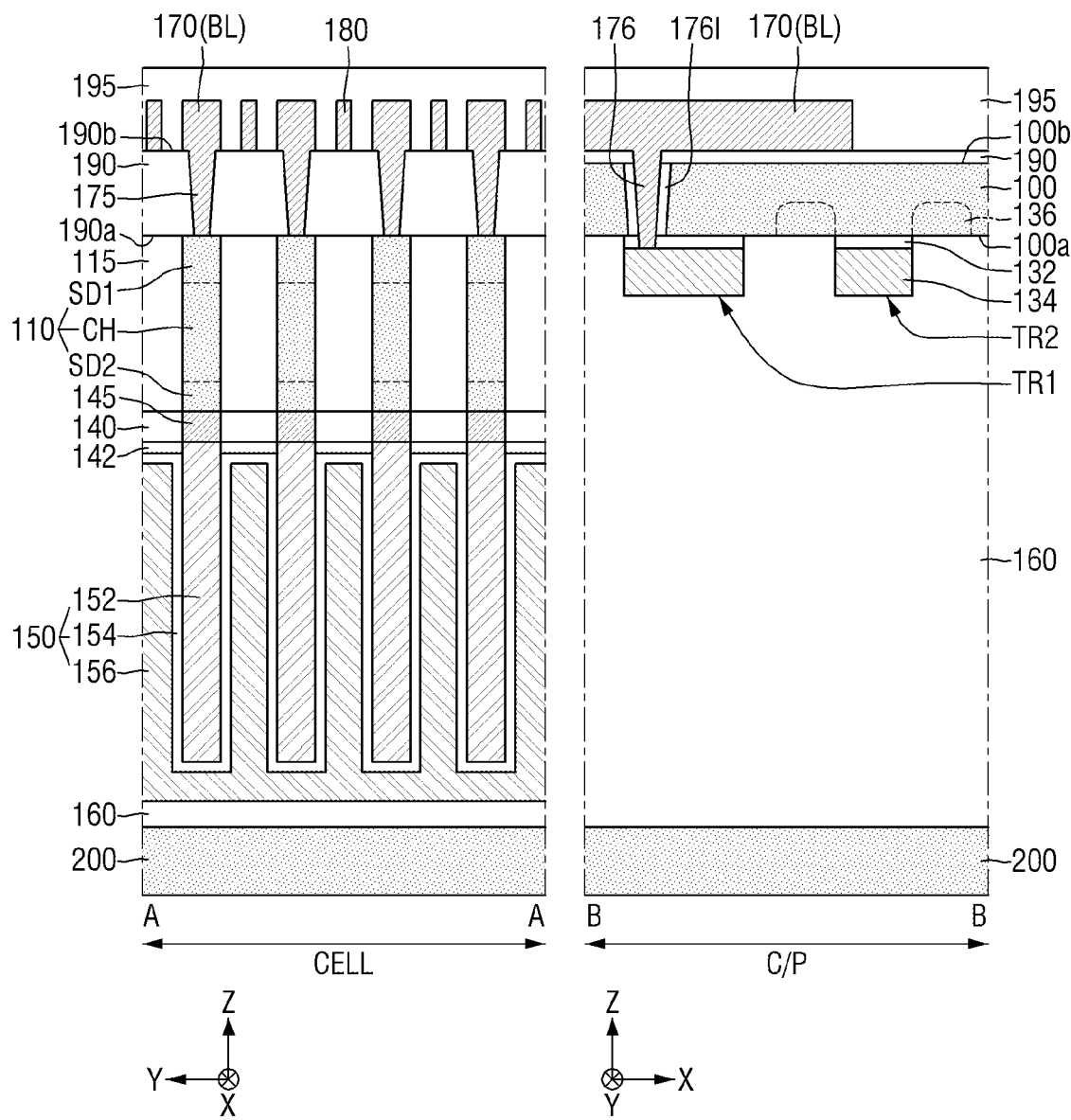
FIG. 7 is a cross-sectional view illustrating a semiconductor memory device according to some embodiments.
Figure 8:
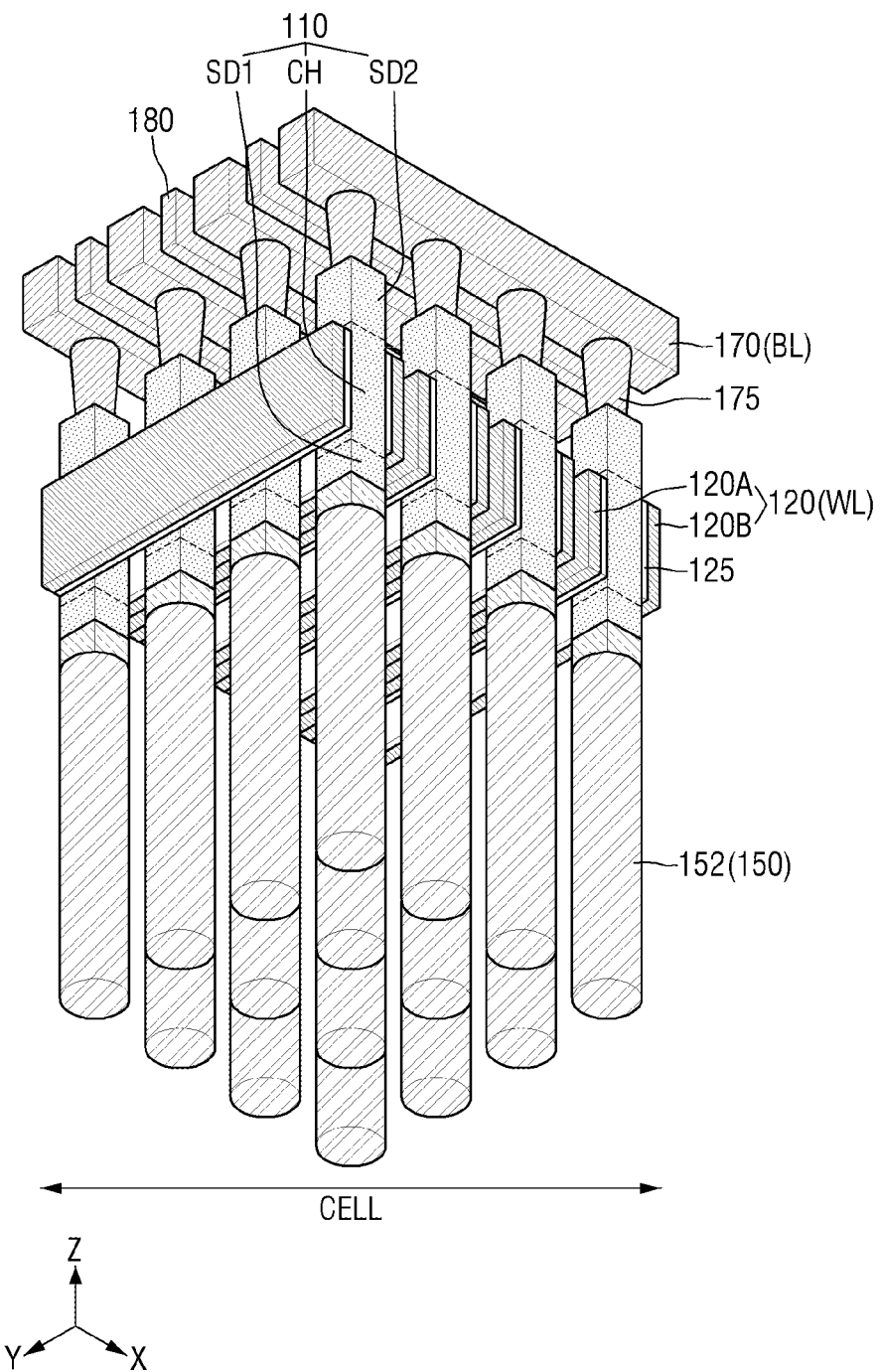
FIG. 8 is a partial perspective view illustrating a cell area of FIG. 7.

FIG. 7 is a cross-sectional view illustrating a semiconductor memory device according to some embodiments. FIG. 8 is a partial perspective view illustrating a cell area of FIG. 7. For convenience of description, portions duplicated with those described with reference to FIGS. 1 to 4 will be described briefly or omitted.

Referring to FIGS. 7 and 8, the semiconductor memory device according to some embodiments further includes a shielding line 180.

The shielding line 180 may be formed on the first rear surface 190b of the base insulating layer 190. Also, the shielding line 180 may be spaced apart from the active pattern 110 by the base insulating layer 190. The shielding line 180 may be interposed between two adjacent second conductive lines 170 and then extending in the second direction X. The shielding line 180 may reduce coupling between the two adjacent second conductive lines 170.

In some embodiments, the shielding line 180 may be disposed so as not to overlap the active pattern 110 in the third direction Z. In some embodiments, an upper surface of the shielding line 180 may be disposed on an upper surface and a coplanar surface of the second conductive line 170, and a lower surface of the shielding line 180 may be disposed on a lower surface and a coplanar surface of the second conductive line 170.

The shielding line 180 may include, for example, doped polysilicon, metal, conductive metal nitride, conductive metal silicide, conductive metal oxide, or their combination. For example, the shielding line 180 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or their combination.

Figure 9:
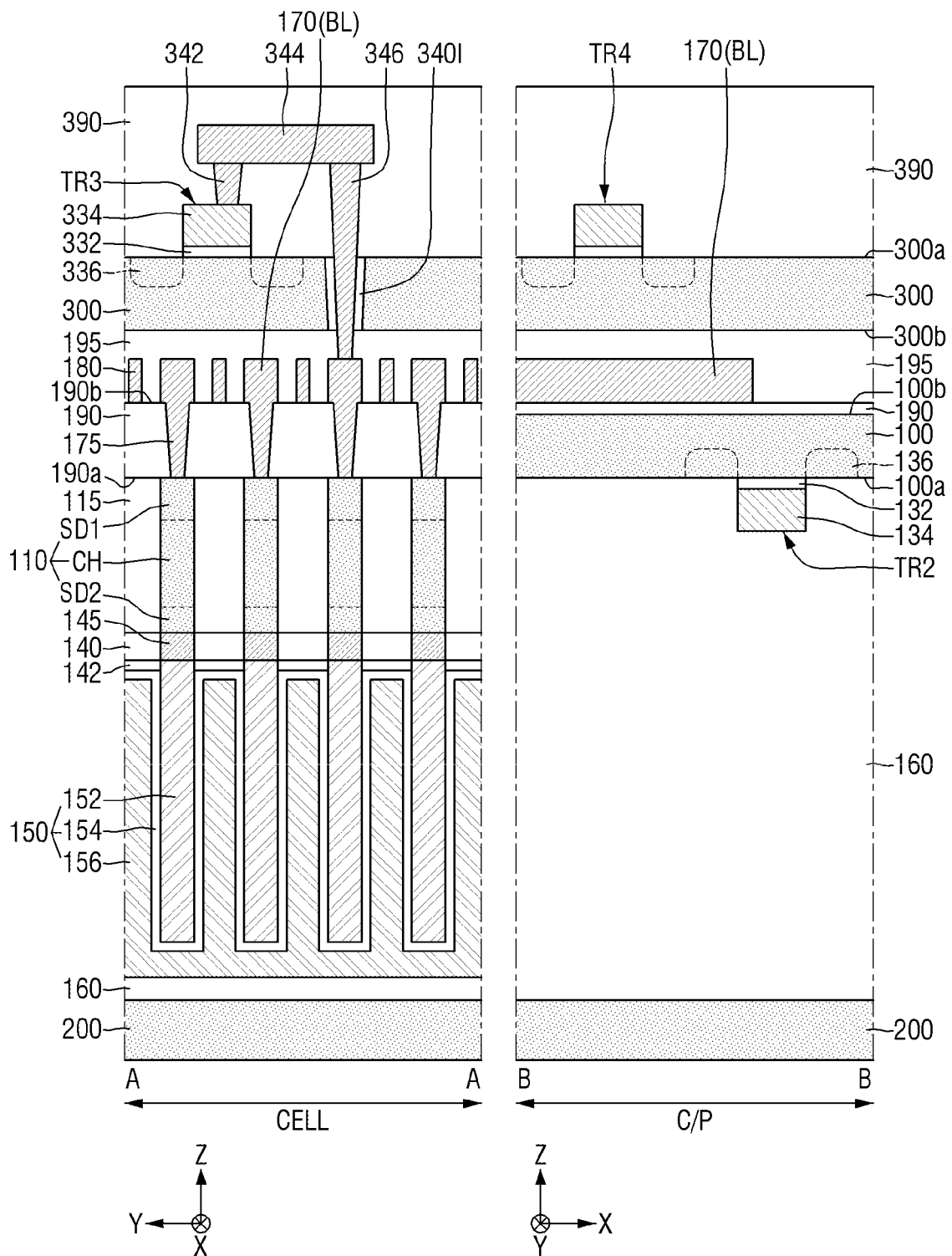
FIG. 9 is a cross-sectional view illustrating a semiconductor memory device according to some embodiments.

In some embodiments, the shielding line 180 may be formed at the same level as the second conductive line 170. For example, the second conductive line 170 and the shielding line 180 may include the same material, or may have the same material composition FIG. 9 is a cross-sectional view illustrating a semiconductor memory device according to some embodiments. For convenience of description, portions duplicated with those described with reference to FIGS. 1 to 8 will be described briefly or omitted.

Referring to FIG. 9, the semiconductor memory device according to some embodiments includes a third semiconductor substrate 300, a third circuit element TR3, a fourth circuit element TR4, and a second rear insulating layer 390.

The third semiconductor substrate 300 may be disposed on the first rear surface 190b of the base insulating layer 190 and the second rear surface 100b of the first semiconductor substrate 100. For example, the third semiconductor substrate 300 may be disposed on the first rear insulating layer 195 (e.g., on an upper surface of the first rear insulating layer 195 of FIG. 3). The third semiconductor substrate 300 may include a third front surface 300a and a third rear surface 300b, which are opposite to each other. The third rear surface 300b of the third semiconductor substrate 300 may face the first rear surface 190b of the base insulating layer 190 and the second rear surface 100b of the first semiconductor substrate 100.

The third semiconductor substrate 300 may be a bulk silicon or a silicon-on-insulator (SOI). The third semiconductor substrate 300 may be a silicon substrate, or may include other materials such as silicon germanium, silicon germanium on insulator (SGOI), indium antimonide, lead telluride compound, indium arsenide, indium phosphide, gallium arsenide or gallium antimonide.

The third circuit element TR3 and the fourth circuit element TR4 may be formed on the third front surface 300a of the third semiconductor substrate 300. The third circuit element TR3 may be disposed in the cell area CELL, and the fourth circuit element TR4 may be disposed in the peripheral area C/P. The third circuit element TR3 and the fourth circuit element TR4 may be control elements that control functions of the semiconductor memory devices implemented in the cell area CELL. For example, each of the third circuit element TR3 and the fourth circuit element TR4 may include a column decoder, a row decoder, a sense amplifier SA, or a sub word line driver SWL of the semiconductor memory device according to some embodiments.

In some embodiments, each of the third circuit element TR3 and the fourth circuit element TR4 may be a transistor that uses a portion of the third semiconductor substrate 300 as a channel layer. For example, each of the third circuit element TR3 and the fourth circuit element TR4 may include a third gate dielectric layer 332, a fourth gate electrode 334, and a fourth source/drain area 336. The fourth gate electrode 334 may extend along the third front surface 300a of the third semiconductor substrate 300. The third gate dielectric layer 332 may be interposed between the third semiconductor substrate 300 and the fourth gate electrode 334. The fourth source/drain area 336 may be formed in the third semiconductor substrate 300 on a side of the fourth gate electrode 334.

The second rear insulating layer 390 may be formed on the third front surface 300a of the third semiconductor substrate 300. The second rear insulating layer 390 may cover the third circuit element TR3 and the fourth circuit element TR4, which are formed on the third semiconductor substrate 300.

The second rear insulating layer 390 may include, but is not limited to, silicon oxide, silicon oxynitride, a low-k material having a dielectric constant lower than that of the silicon oxide, or their combination.

In some embodiments, the third circuit element TR3 may be electrically connected to the second conductive line 170. For example, a second through via 346 may be connected to the second conductive line 170 by passing through the third semiconductor substrate 300 in the cell area CELL. Further, wiring structures 342 and 344 connected to the fourth gate electrode 334 of the third circuit element TR3 may be formed in the second rear insulating layer 390. The fourth gate electrode 334 of the third circuit element TR3 may be connected to the second conductive line 170 through the wiring structures 342 and 344 and the second through via 346. The third circuit element TR3 is electrically connected to the second conductive line 170 serving as the bit line BL, whereby the third circuit element TR3 may be provided as the sense amplifier SA of the semiconductor memory device according to some embodiments. In some embodiments, the third circuit element TR3 provided as the sense amplifier SA may be disposed on both ends of the second conductive line 170 adjacent to the peripheral area C/P.

In some embodiments, a second via insulating layer 3401 extending along a side of the second through via 346 may be formed in the third semiconductor substrate 300. The second through via 346 may be electrically spaced apart from the third semiconductor substrate 300 by the second via insulating layer 3401.

In some embodiments, the fourth circuit element TR4 may be provided as another control element except for or different than the sense amplifier SA in the semiconductor memory device according to some embodiments. For example, although not shown in detail, the fourth circuit element TR4 may be electrically connected to the first conductive line 120 serving as the word line WL. The fourth circuit element TR4 may be provided as the sub word line driver SWL of the semiconductor memory device according to some embodiments.

In FIG. 9, although the first circuit element TR1 on the first semiconductor substrate 100 is omitted, this is only by way of example. Alternatively, as shown in FIG. 3, the first circuit element TR1 may be formed on the first semiconductor substrate 100. In this case, the first circuit element TR1 may be provided as a portion of the plurality of sense amplifiers SA corresponding to the plurality of second conductive lines 170, and the third circuit element TR3 may be provided as another portion of the plurality of sense amplifiers SA corresponding to the plurality of second conductive lines 170.

Figure 10:
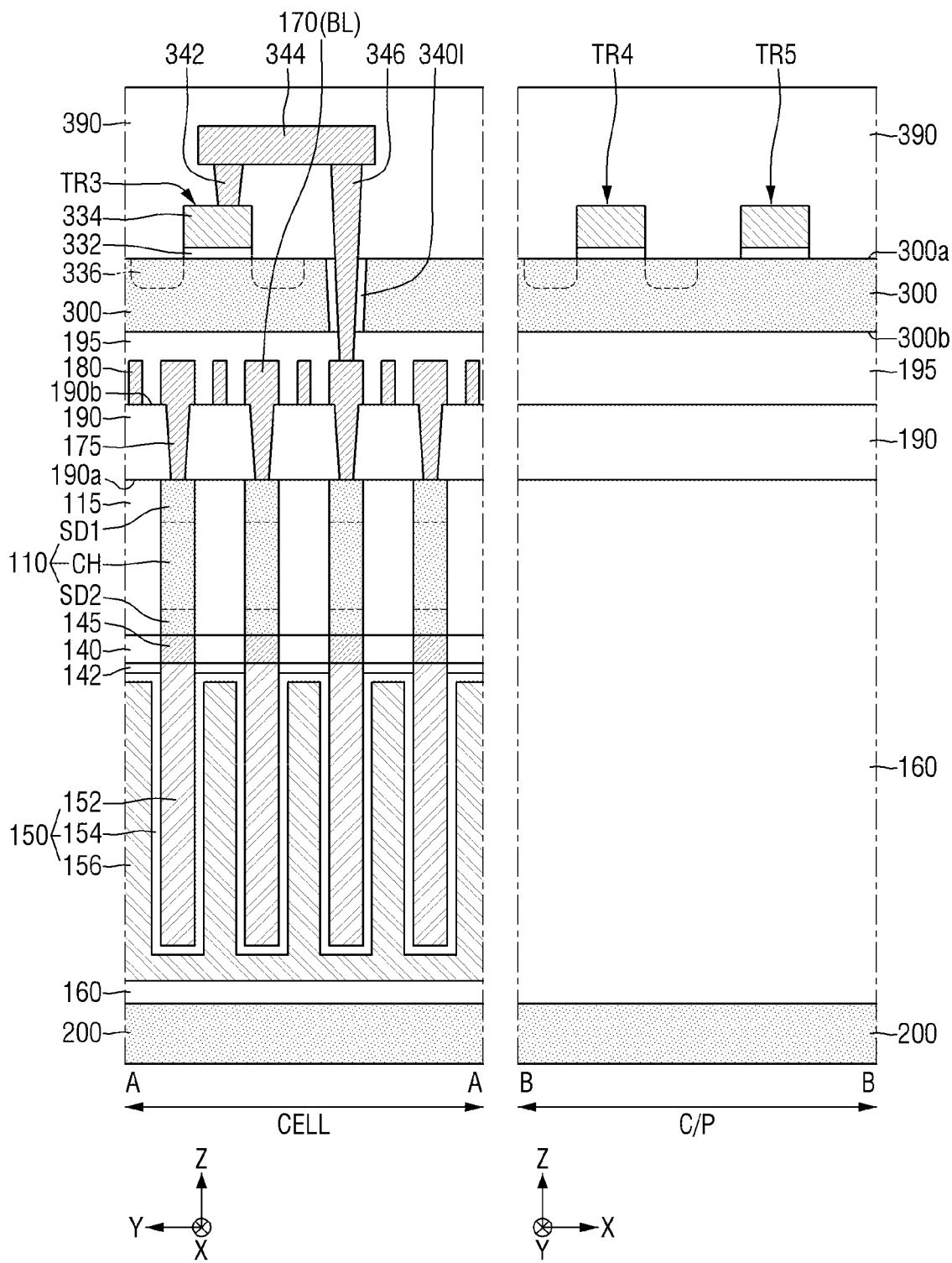
FIG. 10 is a cross-sectional view illustrating a semiconductor memory device according to some embodiments.

FIG. 10 is a cross-sectional view illustrating a semiconductor memory device according to some embodiments. For convenience of description, portions duplicated with those described with reference to FIGS. 1 to 9 will be described briefly or omitted.

Referring to FIG. 10, the semiconductor memory device according to some embodiments includes a third semiconductor substrate 300, a third circuit element TR3, a fourth circuit element TR4, a fifth circuit element TR5, and a second rear insulating layer 390. Since the third semiconductor substrate 300, the third circuit element TR3, the fourth circuit element TR4, and the second rear insulating layer 390 are similar to those described with reference to FIG. 9, further detailed description will be omitted.

The fifth circuit element TR5 may be formed on the third front surface 300a of the third semiconductor substrate 300 in the peripheral area C/P. The fifth circuit element TR5 may be a control element that controls the function of the semiconductor memory devices implemented in the cell area CELL. For example, the fifth circuit element TR5 may include a column decoder, a row decoder, a sense amplifier SA, or a sub word line driver SWL of the semiconductor memory device according to some embodiments.

In some embodiments, the fifth circuit element TR5 may be a transistor that uses a portion of the third semiconductor substrate 300 as a channel layer. For example, the fifth circuit element TR5 may include a third gate dielectric layer 332, a fourth gate electrode 334, and a fourth source/drain area 336.

In some embodiments, the fifth circuit element TR5 may be provided as another control element except for or different than the sense amplifier SA in the semiconductor memory device according to some embodiments. For example, although not shown in detail, the fifth circuit element TR5 may be electrically connected to the first conductive line 120 serving as the word line WL. The fifth circuit element TR5 may be provided as the sub word line driver SWL of the semiconductor memory device according to some embodiments.

In some embodiments, the first semiconductor substrate 100, the first circuit element TR1 and the second circuit element TR2, which are disposed in the peripheral area C/P, may be omitted. For example, the first semiconductor substrate 100 of FIG. 3 disposed in the peripheral area C/P may be removed. A portion of the base insulating layer 190 disposed in the peripheral area C/P may cover the second front insulating layer 160.

In some embodiments, the third circuit element TR3 may be provided as a plurality of sense amplifiers SA corresponding to the plurality of second conductive lines 170. In some other embodiments, the third circuit element TR3 may be provided as a portion of the plurality of sense amplifiers SA corresponding to the plurality of second conductive lines 170, and the fourth circuit element TR4 may be provided as another portion of the plurality of sense amplifiers SA corresponding to the plurality of second conductive lines 170.

In FIG. 10, although the bit line contact 175 is present, this is only by way of example. As the case may be, the bit line contact 175 may be omitted. For example, a lower surface of the second conductive line 170 extending in the second direction X in the insulating structures 190 and 195 may be directly in contact with the upper surface of the active pattern 110. As used herein, when elements are described as being in direct or directly in contact with other elements, no intervening elements are present.

Hereinafter, a method for fabricating a semiconductor memory device according to example embodiments will be described with reference to FIGS. 1 to 28.

FIGS. 11 to 18 are views illustrating intermediate steps to describe a method for fabricating a semiconductor memory device according to some embodiments. For convenience of description, portions duplicated with those described with reference to FIGS. 1 to 4 will be described briefly or omitted.

Figure 11:
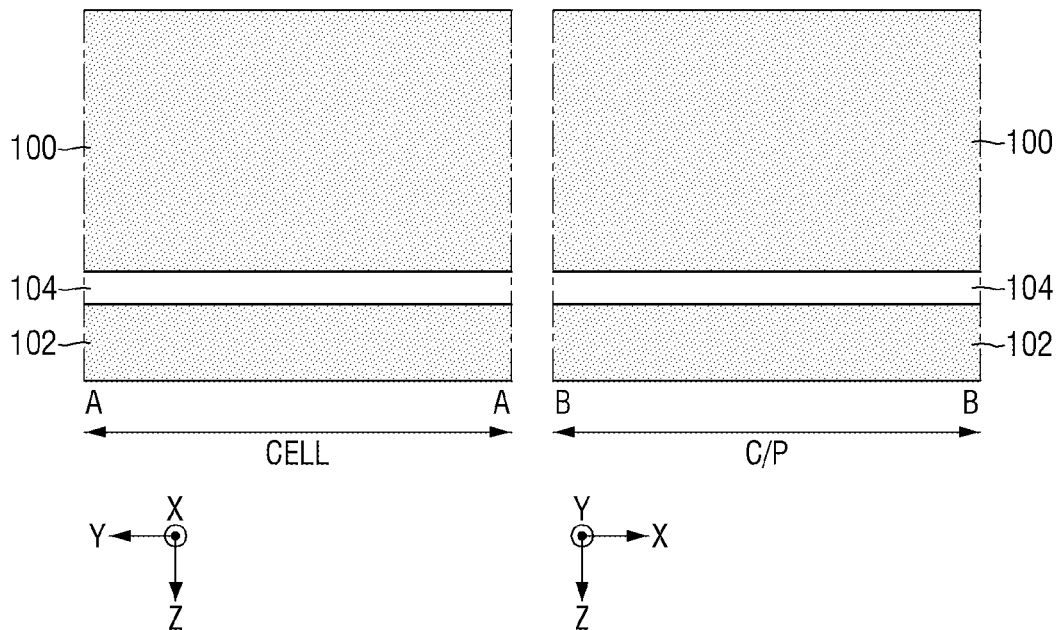
FIGS. 11, 12, 13, 14, 15, 16, 17, and 18 are views illustrating intermediate steps to describe a method for fabricating a semiconductor memory device according to some embodiments.

Referring to FIG. 11, a first semiconductor substrate 100 is provided.

A portion of the first semiconductor substrate 100 may be disposed in the cell area CELL, and another portion of the first semiconductor substrate 100 may be disposed in the peripheral area C/P. The first semiconductor substrate 100 may be a bulk silicon or a silicon-on-insulator (SOI). The first semiconductor substrate 100 may be a silicon substrate, or may include other materials such as silicon germanium, silicon germanium on insulator (SGOI), indium antimonide, lead telluride compound, indium arsenide, indium phosphide, gallium arsenide or gallium antimonide. In some embodiments, the first semiconductor substrate 100 may include a single crystal semiconductor material. For example, the first semiconductor substrate 100 may include single crystal silicon.

In some embodiments, the first semiconductor substrate 100 may be stacked on a base substrate 102 and an insertion layer 104. The base substrate 102 and the insertion layer 104 may be provided for a bonding process for the first semiconductor substrate 100, which will be described later. For example, the base substrate 102 may be, but is not limited to, a wafer, and the insertion layer 104 may be, but is not limited to, a silicon germanium (SiGe) layer.

In some embodiments, the first semiconductor substrate 100 may be an epitaxial layer formed on the insertion layer 104 by an epitaxial growth process.

Figure 12:
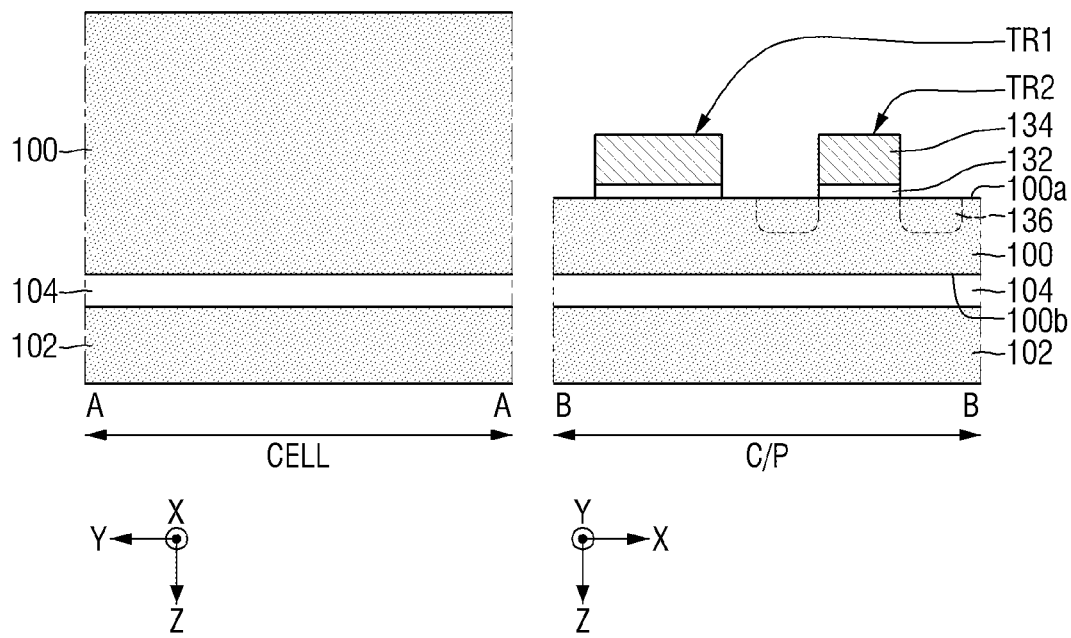

Referring to FIG. 12, a first circuit element TR1 and a second circuit element TR2 are formed on the first semiconductor substrate 100.

The first and second circuit elements TR1 and TR2 may be formed on the first semiconductor substrate 100 in the peripheral area C/P. In some embodiments, each of the first and second circuit elements TR1 and TR2 may be a transistor that uses a portion of the first semiconductor substrate 100 as a channel layer. For example, each of the first and second circuit elements TR1 and TR2 may include a second gate dielectric layer 132, a third gate electrode 134, and a third source/drain area 136.

In some embodiments, before the first circuit element TR1 and the second circuit element TR2 are formed, a recess process for the first semiconductor substrate 100 in the peripheral area C/P may be performed. As the recess process is performed, a height of the upper surface of the first semiconductor substrate 100 in the peripheral area C/P may be lower than that of the upper surface of the first semiconductor substrate 100 in the cell area CELL.

Figure 13:
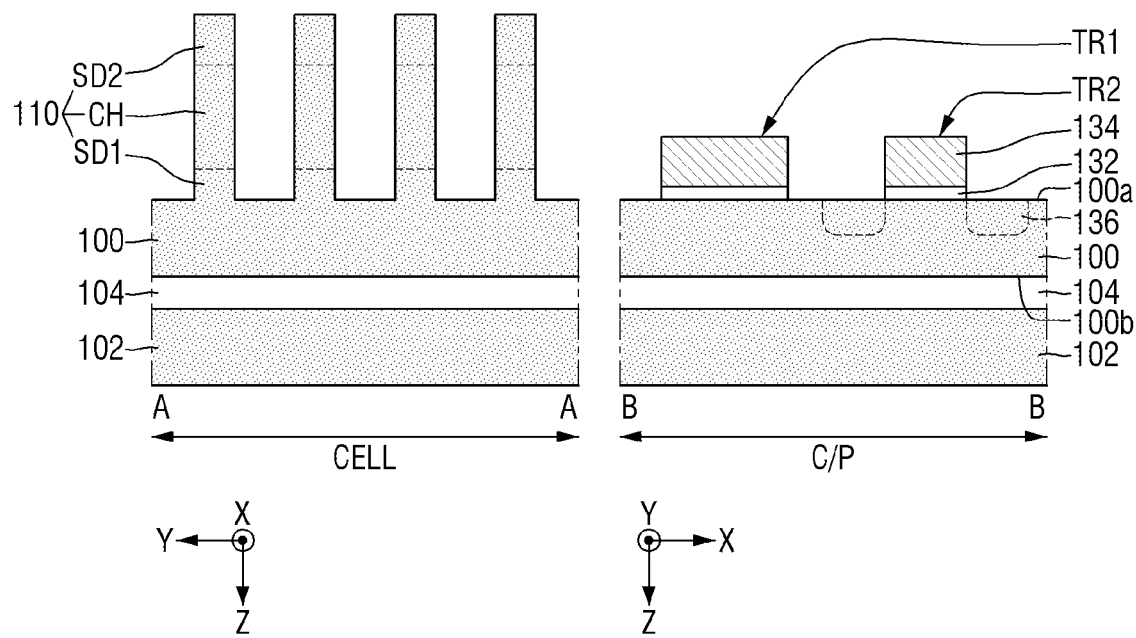

Referring to FIG. 13, an active pattern 110 is formed on the first semiconductor substrate 100.

The active pattern 110 may be formed on the first semiconductor substrate 100 in the cell area CELL. The plurality of active patterns 110 may be spaced apart from each other on a base insulating layer 190. In some embodiments, the active patterns 110 may be arranged in the form of a matrix in the first direction Y and the second direction X.

In some embodiments, the active pattern 110 may be formed by a patterning process for a first front surface 190a of the first semiconductor substrate 100. Therefore, the first semiconductor substrate 100 and the active pattern 110 may include the same material, or may have the same material composition. In some embodiments, the first semiconductor substrate 100 may include a single crystal semiconductor material. For example, the first semiconductor substrate 100 may include single crystal silicon.

The active pattern 110 may include a first source/drain area SD1, a channel area CH, and a second source/drain area SD2, which are arranged along the third direction Z. For example, a doping process for the lower portion and/or the upper portion of the active pattern 110 may be performed. The doping process may include, for example, an ion implantation process that is obliquely performed with respect to the surface of the first semiconductor substrate 100, but is not limited thereto.

Figure 14:
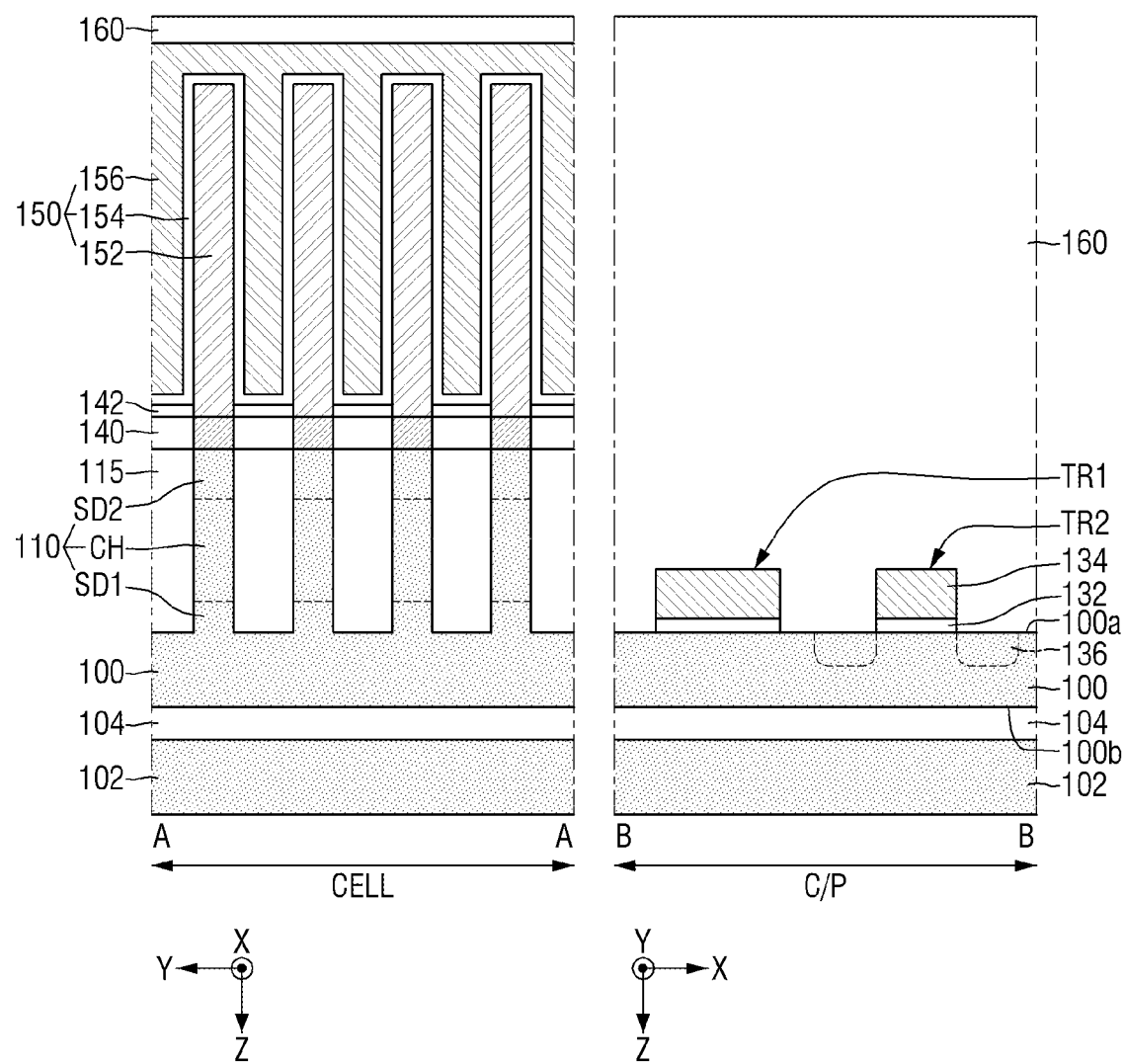

Referring to FIG. 14, a first conductive line 120, a first gate dielectric layer 125, a buried insulating layer 115, a capacitor contact 145, a first front insulating layer 140, a capacitor structure 150, and a second front insulating layer 160 are formed on the first semiconductor substrate 100.

The first conductive line 120, the first gate dielectric layer 125, the buried insulating layer 115, the capacitor contact 145, the first front insulating layer 140, and the capacitor structure 150 may be formed on the active pattern 110 in the cell area CELL. The second front insulating layer 160 may cover the capacitor structure 150 formed in the cell area CELL and the first and second circuit elements TR1 and TR2 formed in the peripheral area C/P. Since the first conductive line 120, the first gate dielectric layer 125, the buried insulating layer 115, the capacitor contact 145, the first front insulating layer 140, the capacitor structure 150, and the second front insulating layer 160 may be formed by various processes which may be known in the art, further detailed description will be omitted.

Figure 15:
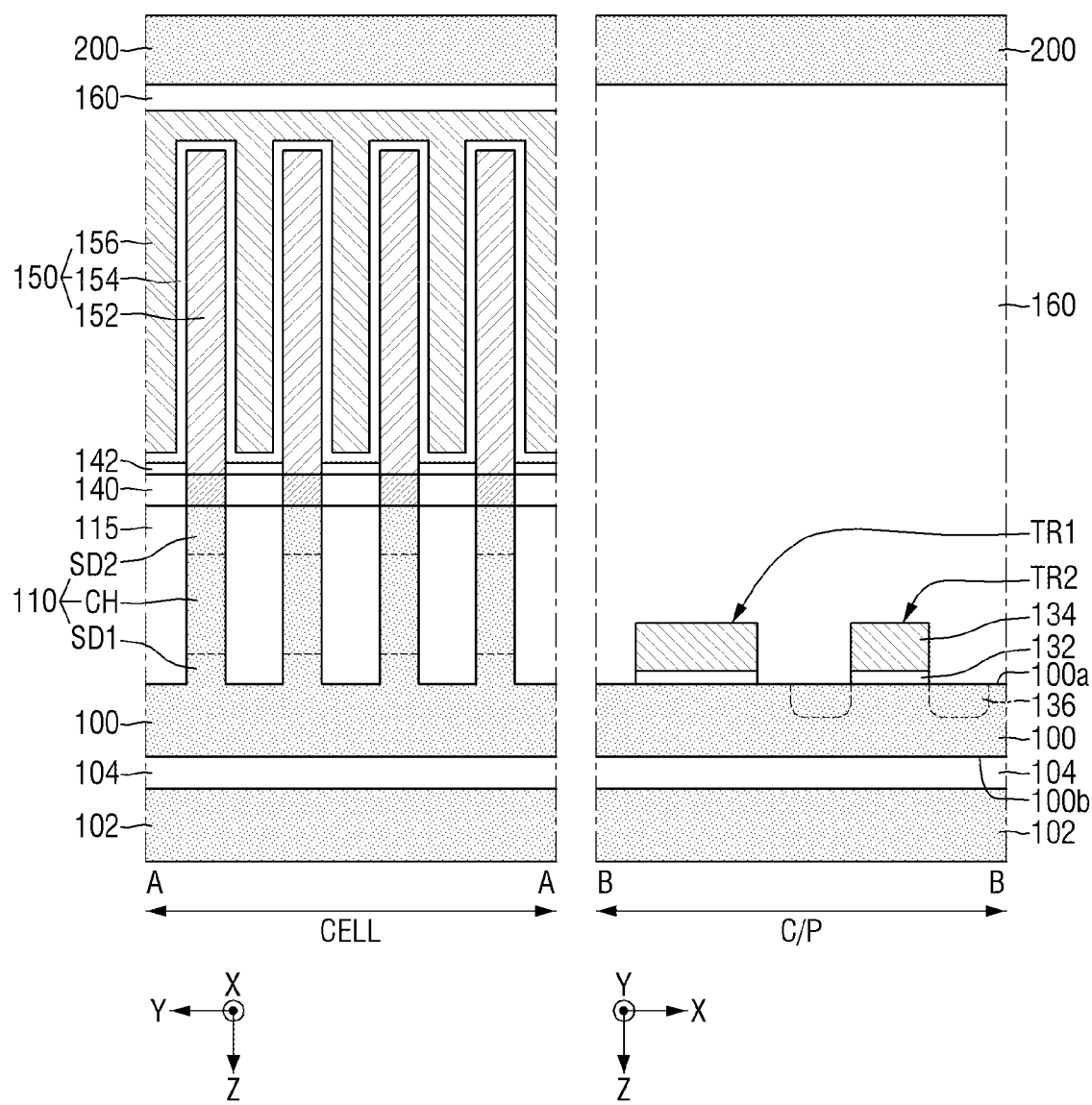

Referring to FIG. 15, a second semiconductor substrate 200 is attached onto the second front insulating layer 160.

The second semiconductor substrate 200 may be attached onto the second front insulating layer 160 by, for example, a wafer bonding method. For example, the second semiconductor substrate 200 including an oxide on a surface may be attached onto the second front insulating layer 160 including an oxide, thereby forming oxide-to-oxide bonding.

Figure 16:
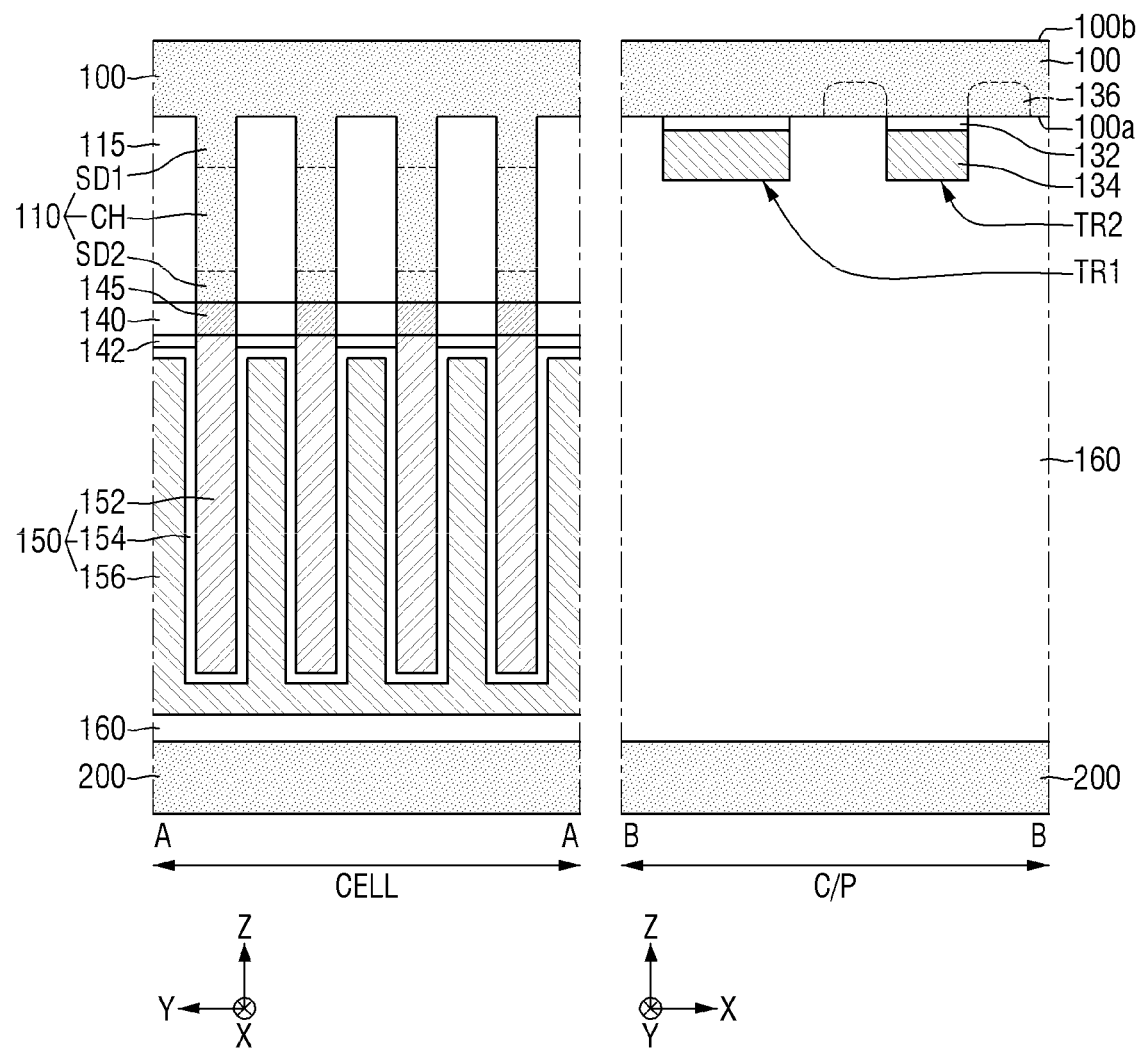

Referring to FIG. 16, the base substrate 102 and the insertion layer 104 are removed.

For example, the result of FIG. 15 may be reversed. Therefore, in contrast with the example shown in FIG. 15, the second semiconductor substrate 200 may be disposed in a lower direction. The second semiconductor substrate 200 may be used as a handling substrate in subsequent processes. For example, the base substrate 102 and the insertion layer 104 may be removed using the second semiconductor substrate 200 as a handling substrate.

Figure 17:
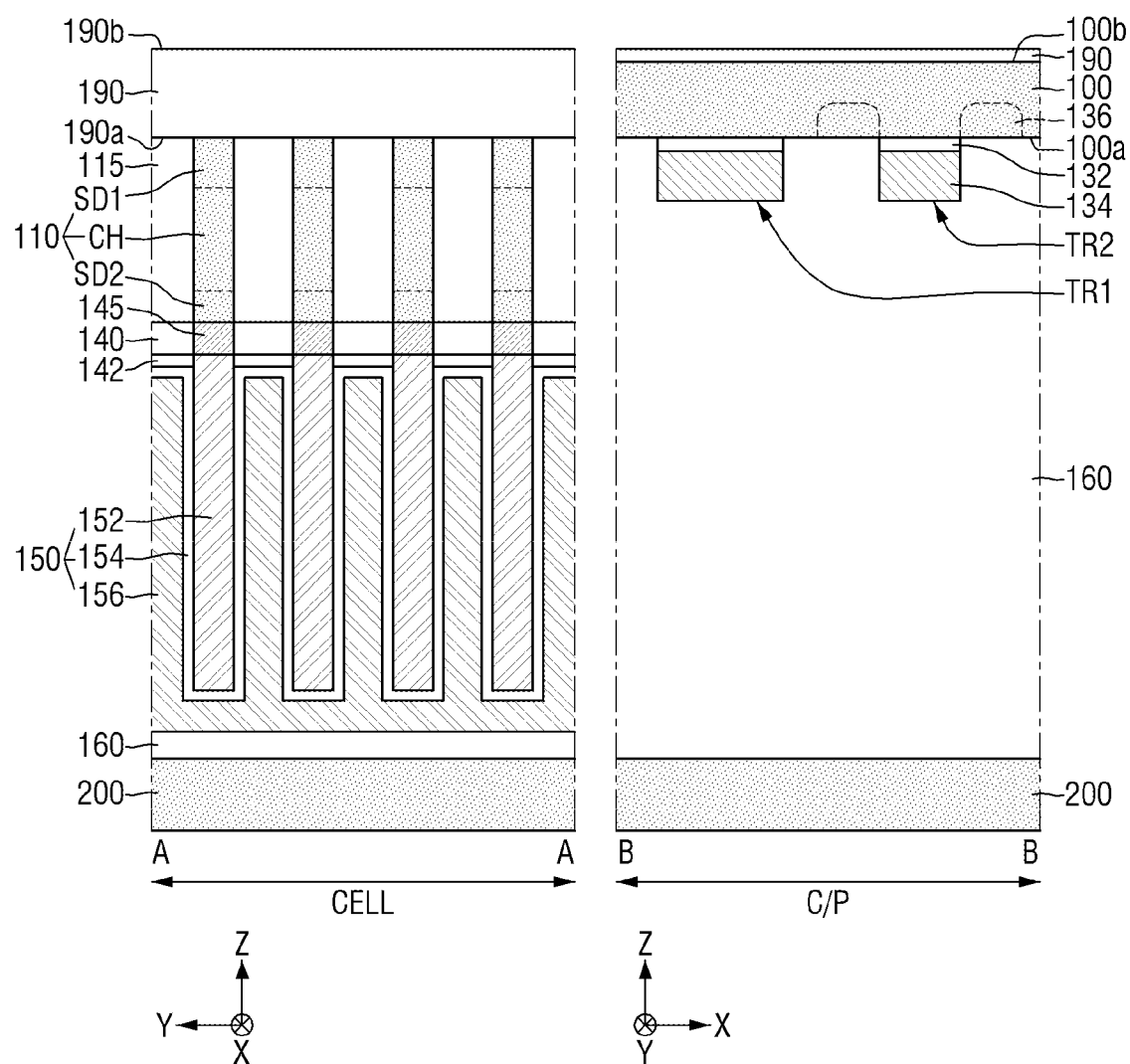

Referring to FIG. 17, the base insulating layer 190 is formed in the cell area CELL.

For example, the first semiconductor substrate 100 in the cell area CELL may be removed. As the first semiconductor substrate 100 in the cell area CELL is removed, the upper surface of the active pattern 110 and the upper surface of the buried insulating layer 115 may be exposed. Subsequently, the base insulating layer 190 covering the upper surface of the active pattern 110 and the upper surface of the buried insulating layer 115 may be formed.

In some embodiments, a portion of the base insulating layer 190 may be disposed even in the peripheral area C/P. A portion of the base insulating layer 190 disposed in the peripheral area C/P may cover the second rear surface 100b of the first semiconductor substrate 100.

Figure 18:
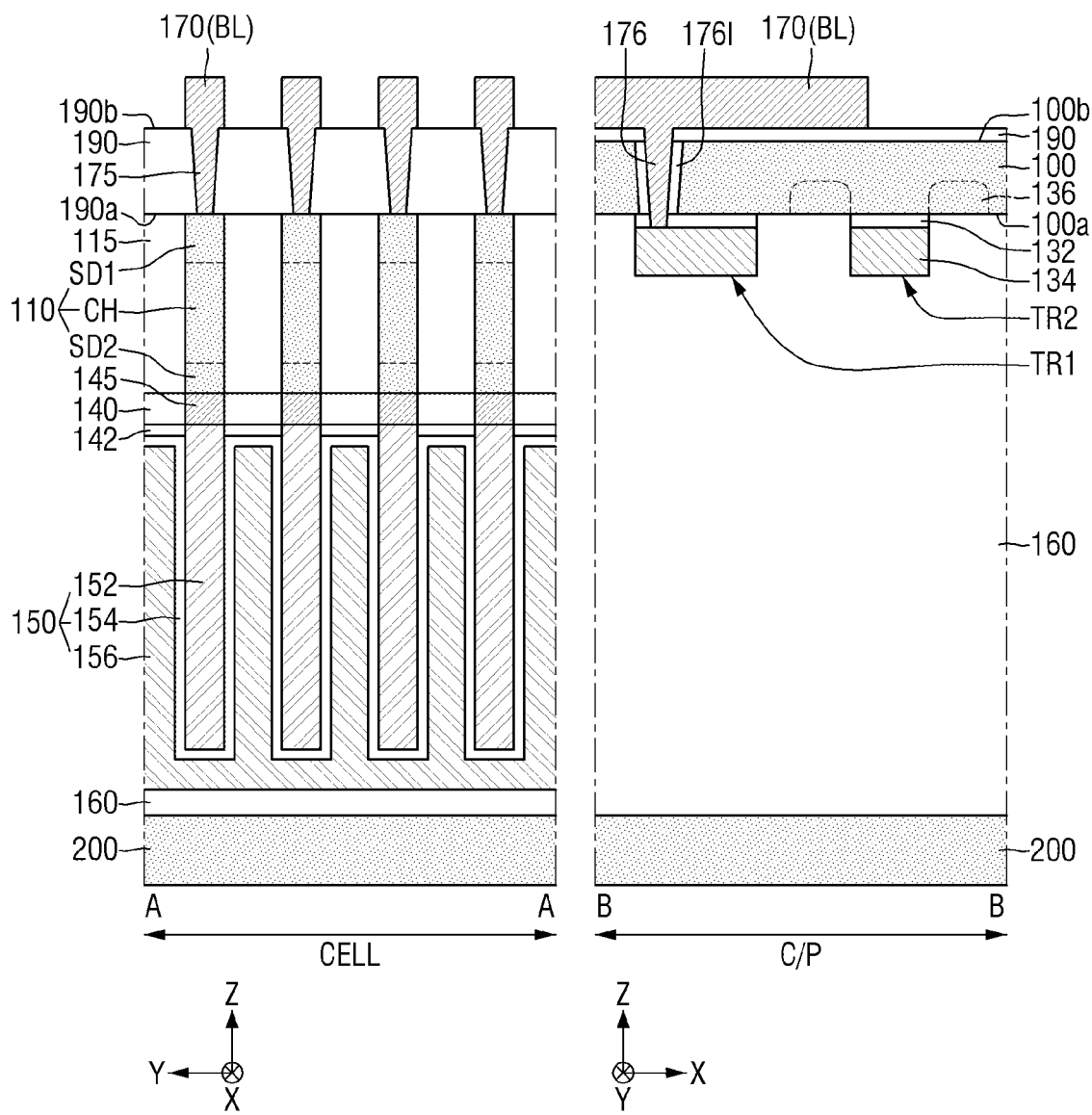

Referring to FIG. 18, a bit line contact 175 and a second conductive line 170 are formed.

For example, a contact hole passing through the base insulating layer 190 may be formed to expose the first source/drain area SD1 of the active pattern 110. A conductive layer covering the base insulating layer 190 may be formed. The conductive layer filling the contact hole may form the bit line contact 175 connected to the first source/drain area SD1 of the active pattern 110. In some embodiments, the second conductive line 170 may be formed by patterning the conductive layer. Therefore, the bit line contact 175 may connect the second conductive line 170 with the active pattern 110.

In some embodiments, one end of the second conductive line 170 may extend to the peripheral area C/P. For example, one end of the second conductive line 170 extending in the second direction X may be disposed on the second rear surface 100b of the first semiconductor substrate 100 adjacent to the base insulating layer 190.

In some embodiments, the first circuit element TR1 may be electrically connected to the second conductive line 170. For example, a first through via 176 for connecting the second conductive line 170 with the third gate electrode 134 of the first circuit element TR1 by passing through the base insulating layer 190 and the first semiconductor substrate 100 may be formed in the peripheral area C/P.

Subsequently, referring to FIG. 3, a first rear insulating layer 195 is formed on the second conductive line 170. As a result, the semiconductor memory device described with reference to FIGS. 2 to 4 may be fabricated.

There may be consumer demand for a semiconductor memory device having an improved degree of integration to provide excellent performance and low cost. In semiconductor memory devices, since the degree of integration may be a factor in the price of a product, a high degree of integration may be desired.

In the semiconductor memory device according to some embodiments, the bit line (i.e., second conductive line 170) may be formed simply by a wafer bonding method to have an improved degree of integration. In detail, as described above, the second conductive line 170 may be formed on the first rear surface 190b of the base insulating layer 190 by using the second semiconductor substrate 200 as a handling substrate. Since the second conductive line 170 may be disposed to overlap the active pattern 110 in the vertical direction (e.g., third direction Z), semiconductor memory devices having an improved degree of integration may be implemented in the cell area CELL (e.g., semiconductor memory devices having a size of $4F^2$ may be implemented).

In addition, in the semiconductor memory device according to some embodiments, the active pattern 110 may include a single crystal semiconductor material even though the active pattern 110 and the second conductive line 170 overlap in the vertical direction (e.g., third direction Z). In detail, as described above, the active pattern 110 may be formed by a patterning process for the first front surface 190a of the first semiconductor substrate 100, and the second conductive line 170 may be formed after the active pattern 110 is formed. In contrast, when the active pattern 110 is formed on the second conductive line 170 after the second conductive line 170 is formed, it may be difficult to form the active pattern 110 that includes a single crystal semiconductor material. As a result, the semiconductor memory device according to some embodiments may provide improved performance.

Figure 19:
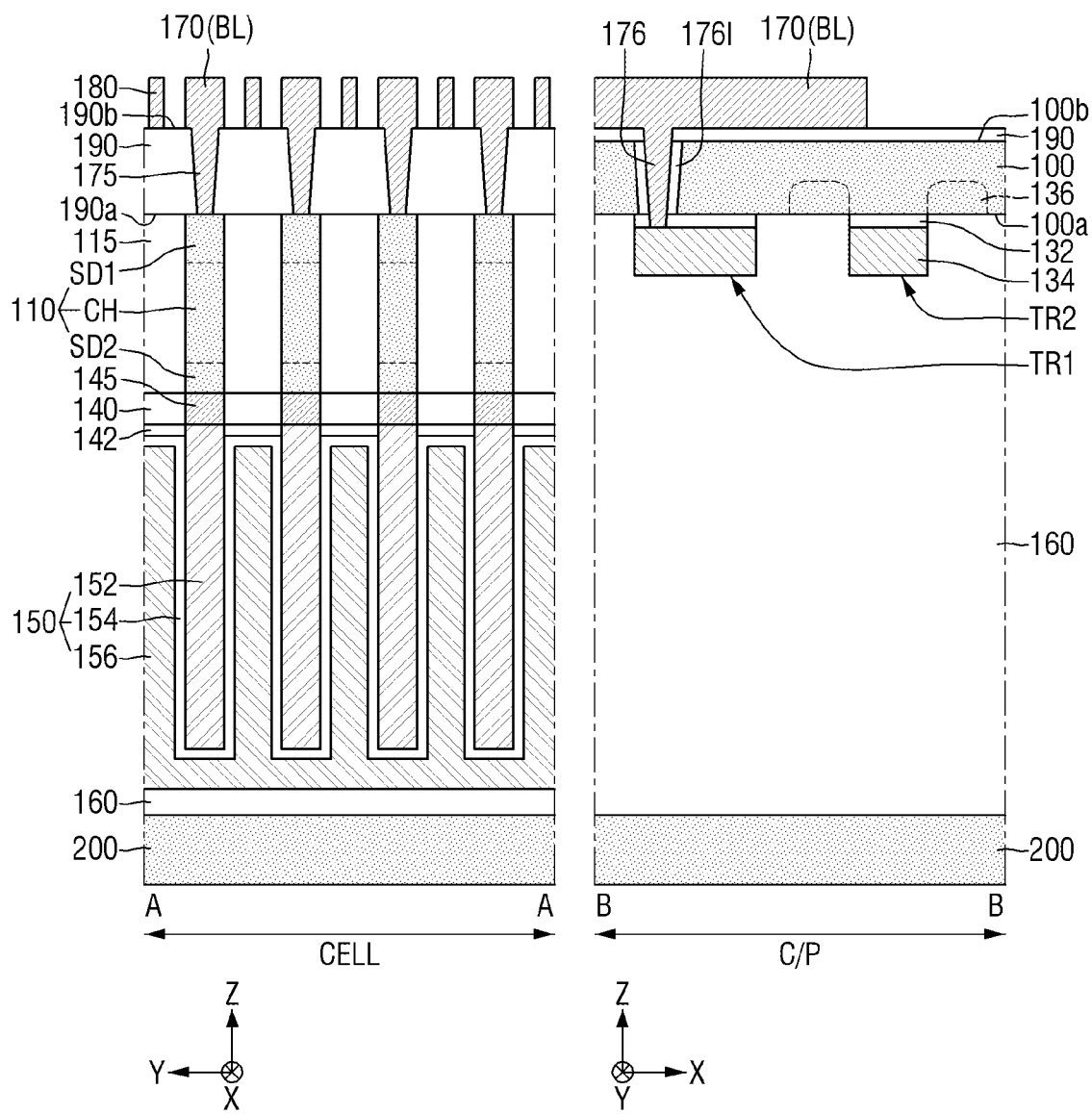
FIG. 19 is a view illustrating intermediate steps to describe a method for fabricating a semiconductor memory device according to some embodiments.

FIG. 19 is a view illustrating intermediate steps to describe a method for fabricating a semiconductor memory device according to some embodiments. For convenience of description, portions duplicated with those described with reference to FIGS. 1 to 18 will be described briefly or omitted. For reference, FIG. 19 is a view illustrating intermediate steps subsequent to FIG. 17.

Referring to FIG. 19, a bit line contact 175, a second conductive line 170, and a shielding line 180 are formed. Since the bit line contact 175 and the second conductive line 170 are formed to be similar to those described with reference to FIG. 18, further detailed description will be omitted.

For example, a conductive layer covering the base insulating layer 190 may be formed. Subsequently, a patterning process for the conductive layer may be performed. As a result, the shielding line 180 interposed between two second conductive lines 170 adjacent to each other and extending in the second direction X may be formed.

In some embodiments, the second conductive line 170 and the shielding line 180 may be formed at the same level. For example, the second conductive line 170 and the shielding line 180 may be formed by the same patterning process.

Figure 20:
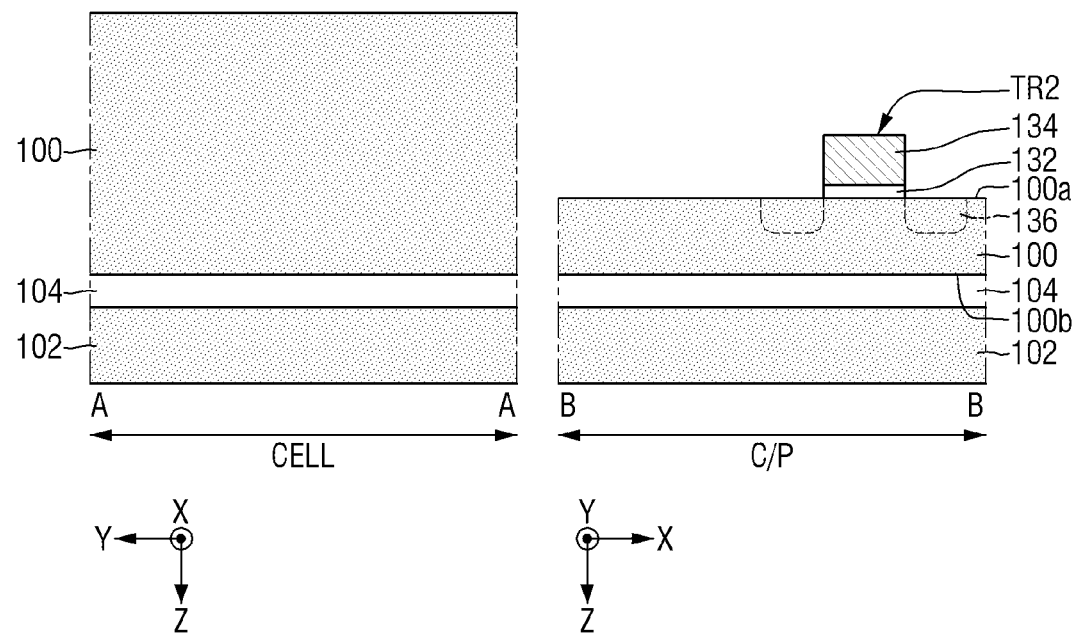
FIGS. 20, 21, and 22 are views illustrating intermediate steps to describe a method for fabricating a semiconductor memory device according to some embodiments.
Figure 21:
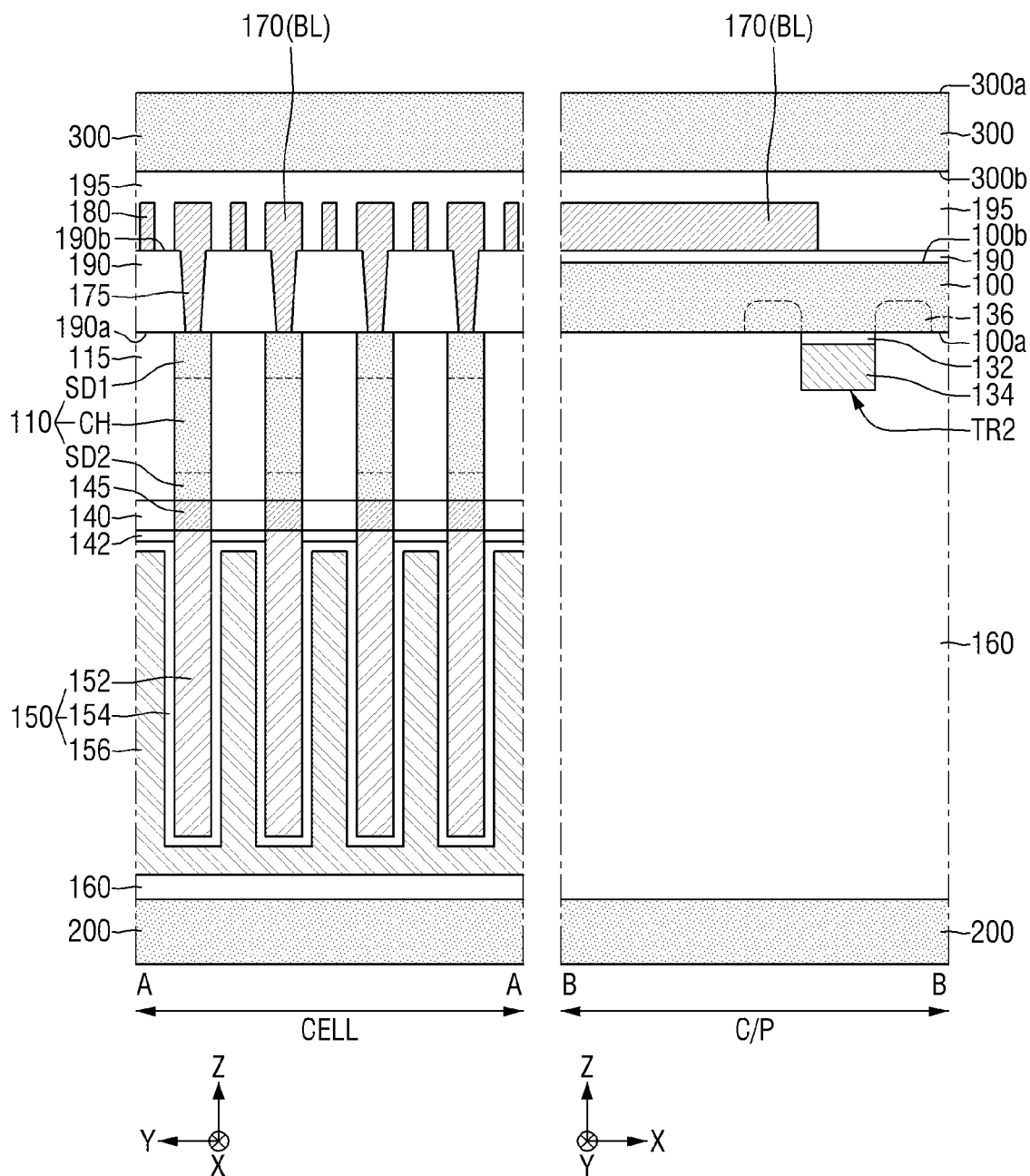
Figure 22:
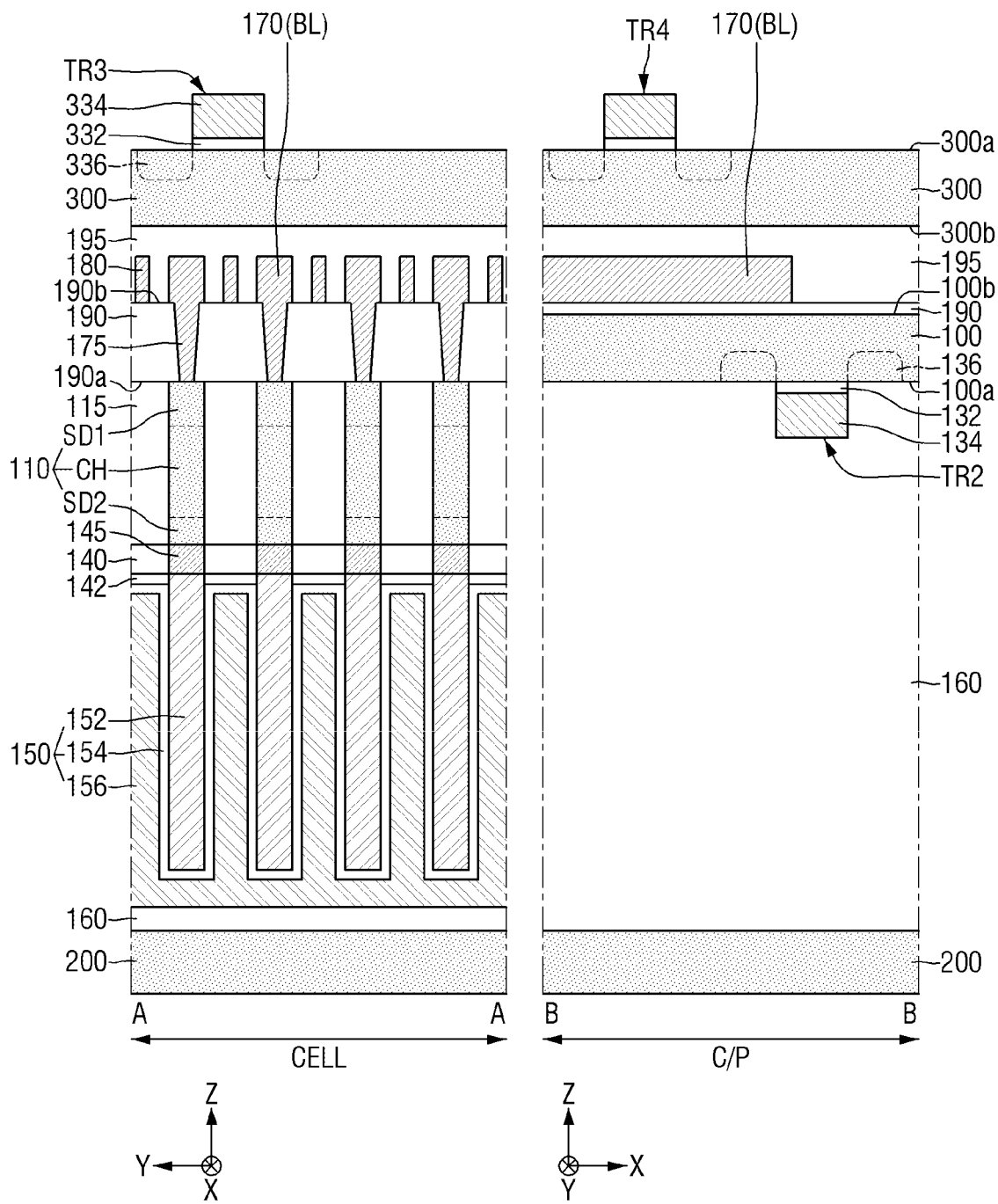

FIGS. 20 to 22 are views illustrating intermediate steps to describe a method for fabricating a semiconductor memory device according to some embodiments. For convenience of description, portions duplicated with those described with reference to FIGS. 1 to 19 will be described briefly or omitted. For reference, FIG. 20 is a view illustrating intermediate steps subsequent to FIG. 11.

Referring to FIG. 20, a second circuit element TR2 is formed on the first semiconductor substrate 100. Since the second circuit element TR2 is formed to be similar to that described with reference to FIG. 12, its detailed description will be omitted.

Referring to FIG. 21, a third semiconductor substrate 300 is formed.

For example, the steps described with reference to FIGS. 13 to 19 may be performed. Subsequently, a first rear insulating layer 195 may be formed on the second conductive line 170 and the shielding line 180. The third semiconductor substrate 300 may be attached onto the first rear insulating layer 195.

The third semiconductor substrate 300 may be attached onto the first rear insulating layer 195 by a wafer bonding method, for example, providing a bonding interface therebetween. For example, the third semiconductor substrate 300 including an oxide on a surface may be attached onto the first rear insulating layer 195 including an oxide, thereby forming an oxide-to-oxide bonding interface.

The third semiconductor substrate 300 may include a third front surface 300a and a third rear surface 300b, which are opposite to each other. The third rear surface 300b of the third semiconductor substrate 300 may face the first rear surface 190b of the base insulating layer 190 and the second rear surface 100b of the first semiconductor substrate 100.

Referring to FIG. 22, a third circuit element TR3 and a fourth circuit element TR4 are formed on the third semiconductor substrate 300.

The third circuit element TR3 may be formed on the third semiconductor substrate 300 in the cell area CELL, and the fourth circuit element TR4 may be formed on the third semiconductor substrate 300 in the peripheral area C/P. In some embodiments, the third circuit element TR3 and the fourth circuit element TR4 may be a transistor that uses a portion of the third semiconductor substrate 300 as a channel layer. For example, each of the third and fourth circuit elements TR3 and TR4 may include a third gate dielectric layer 332, a fourth gate electrode 334, and a fourth source/drain area 336.

Referring to FIG. 9, a second through via 346, a wiring structures 342 and 344, and a second rear insulating layer 390 are formed. As a result, the semiconductor memory device described with reference to FIG. 9 may be fabricated.

In the semiconductor memory device according to some embodiments, at least a portion of the control elements controlling the functions of the semiconductor memory devices may be disposed in the cell area CELL. In detail, as described above, the third circuit element TR3 may be formed on the third semiconductor substrate 300 in the cell area CELL. As a result, a cell-on-peri (COP) structure may be implemented to provide a semiconductor memory device having an improved degree of integration. In addition, since the cell-on-peri (COP) structure is capable of shortening a length of the bit line (i.e., second conductive line 170), a semiconductor memory device with more improved performance may be provided.

Figure 23:
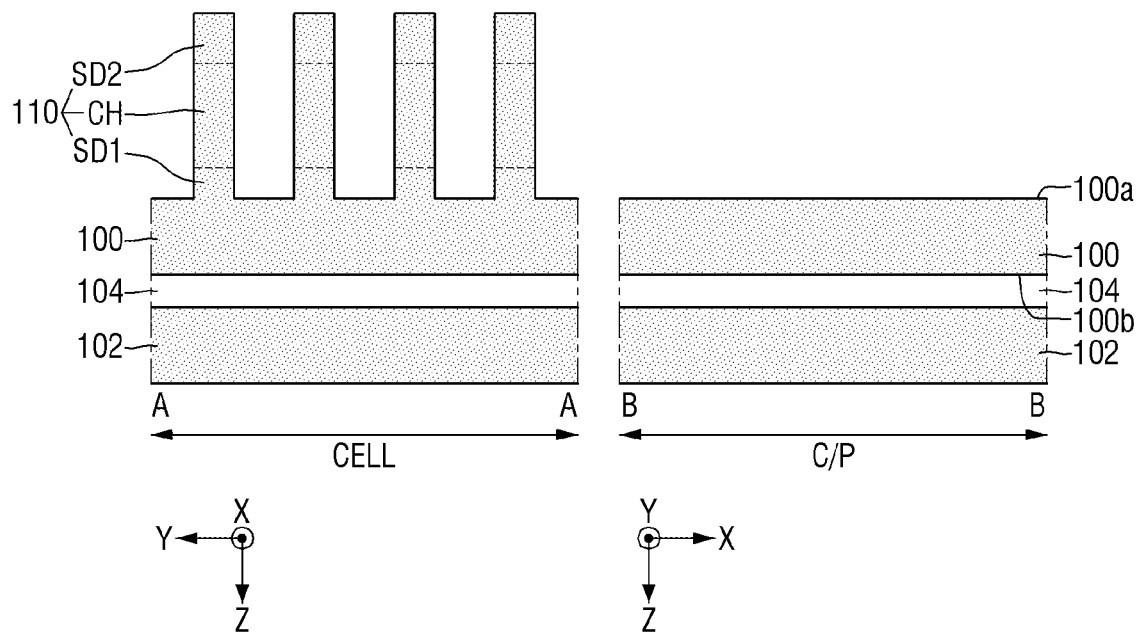
FIGS. 23, 24, 25, 26, 27, and 28 are views illustrating intermediate steps to describe a method for fabricating a semiconductor memory device according to some embodiments.

FIGS. 23 to 28 are views illustrating intermediate steps to describe a method for fabricating a semiconductor memory device according to some embodiments. For convenience of description, portions duplicated with those described with reference to FIGS. 1 to 22 will be described briefly or omitted. For reference, FIG. 23 is a view illustrating intermediate steps subsequent to FIG. 11.

Referring to FIG. 23, an active pattern 110 is formed on a first semiconductor substrate 100. Since the active pattern 110 is formed to be similar to that described with reference to FIG. 13, its detailed description will be omitted.

Figure 24:
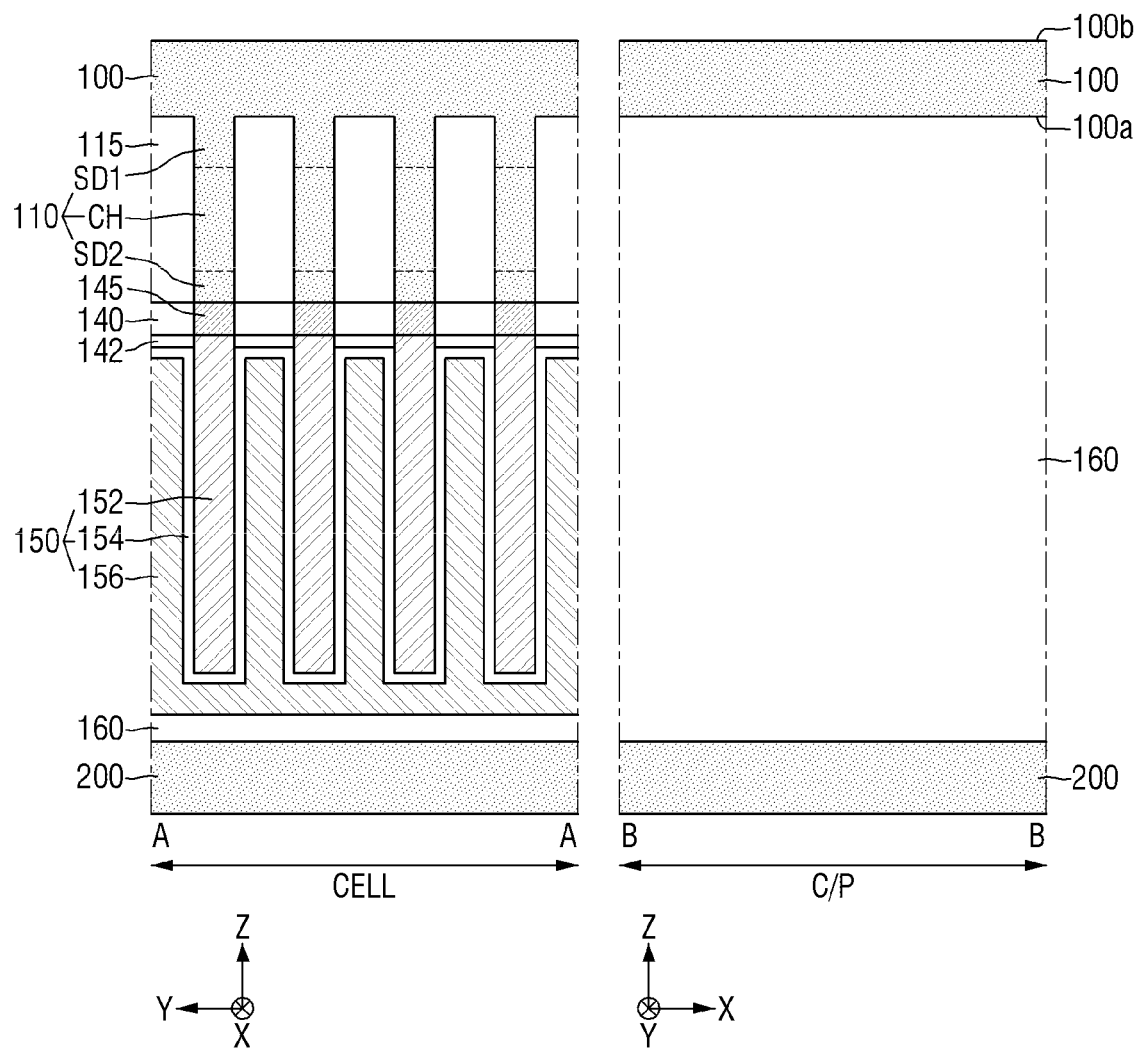

Referring to FIG. 24, a second semiconductor substrate 200 is attached. For example, the steps described with reference to FIGS. 14 to 16 may be performed.

Figure 25:
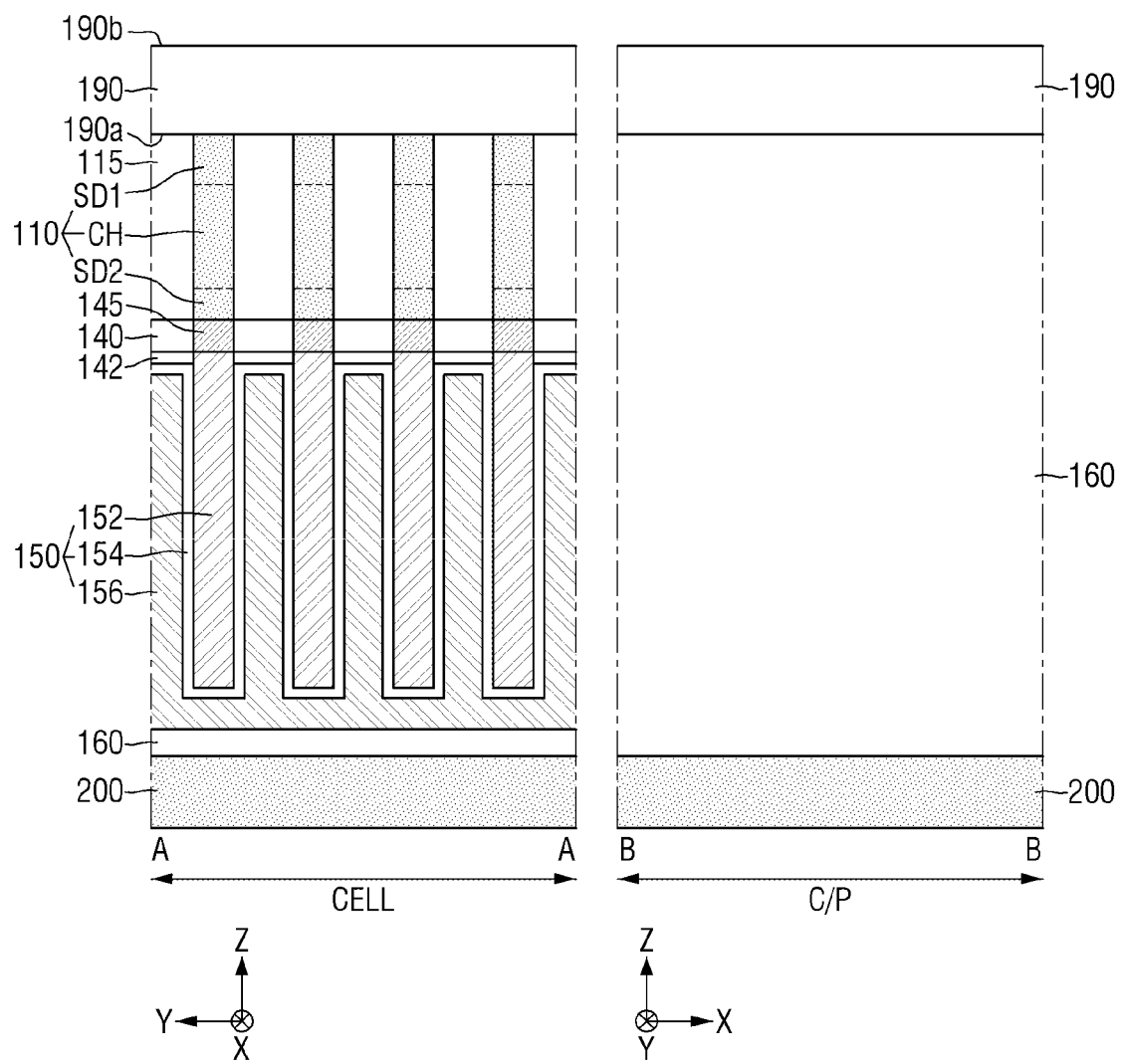

Referring to FIG. 25, a base insulating layer 190 is formed in the cell area CELL and the peripheral area C/P.

For example, the first semiconductor substrate 100 in the cell area CELL and the peripheral area C/P may be removed. As the first semiconductor substrate 100 in the cell area CELL is removed, an upper surface of the active pattern 110 and an upper surface of a buried insulating layer 115 may be exposed. Also, as the first semiconductor substrate 100 in the peripheral area C/P is removed, an upper surface of the second front insulating layer 160 may be exposed. A base insulating layer 190 covering the upper surface of the active pattern 110, the upper surface of the buried insulating layer 115 and the upper surface of the second front insulating layer 160 may be formed.

Figure 26:
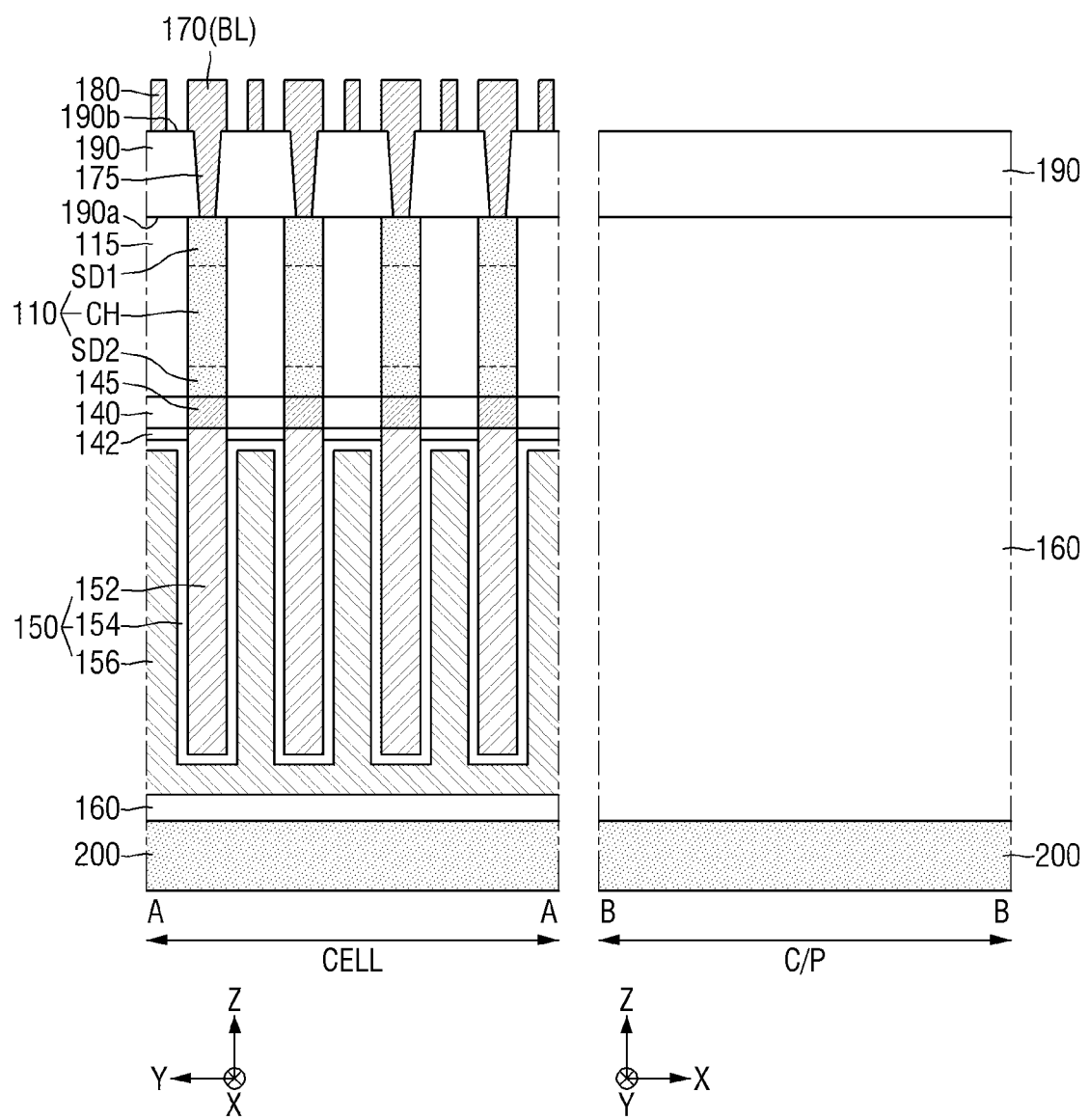

Referring to FIG. 26, a bit line contact 175, a second conductive line 170, and a shielding line 180 are formed. Since the bit line contact 175, the second conductive line 170 and the shielding line 180 are formed to be similar to those described with reference to FIG. 19, further detailed description will be omitted.

Figure 27:
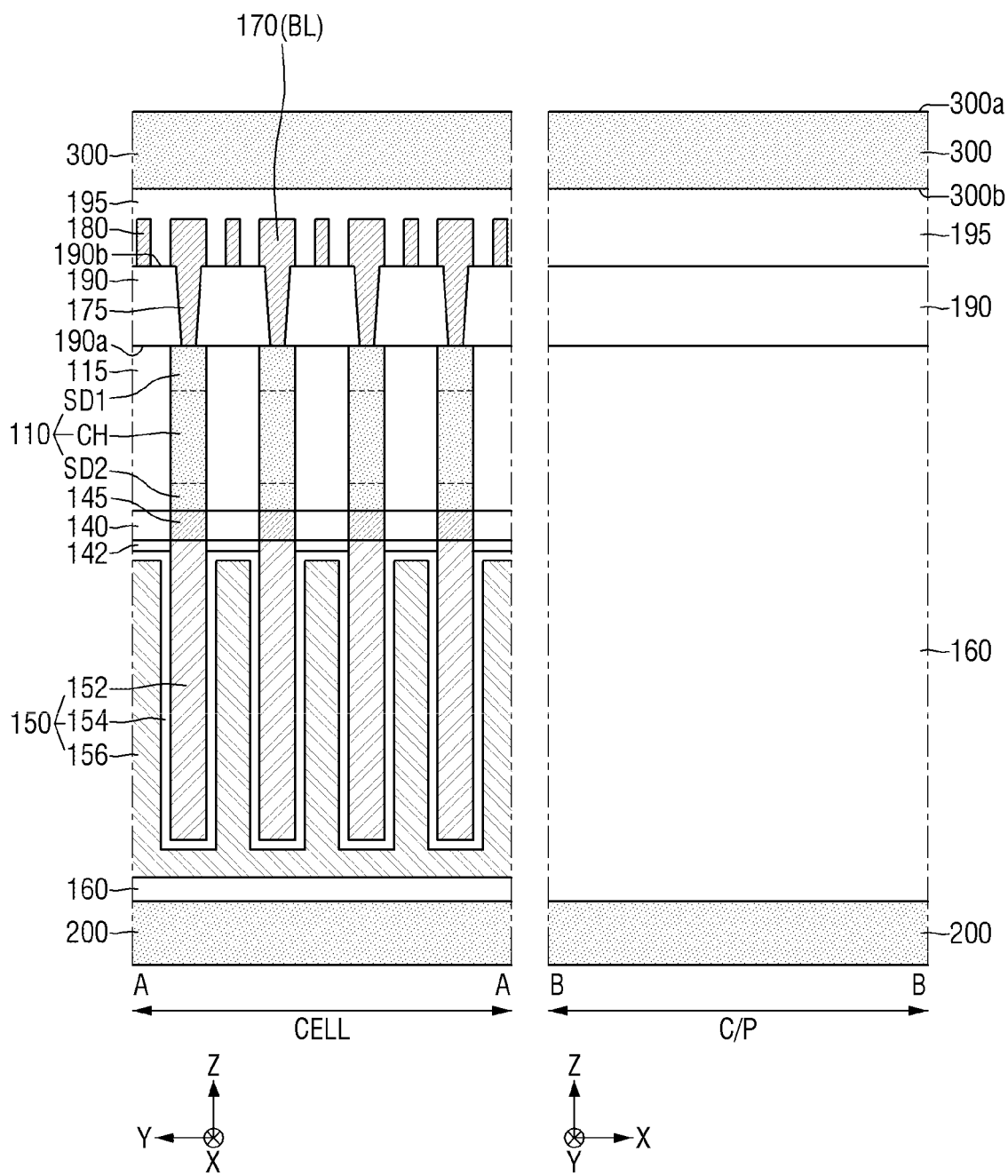

Referring to FIG. 27, a third semiconductor substrate 300 is formed. Since the third semiconductor substrate 300 is formed to be similar to that described with reference to FIG. 21, its detailed description will be omitted.

Figure 28:
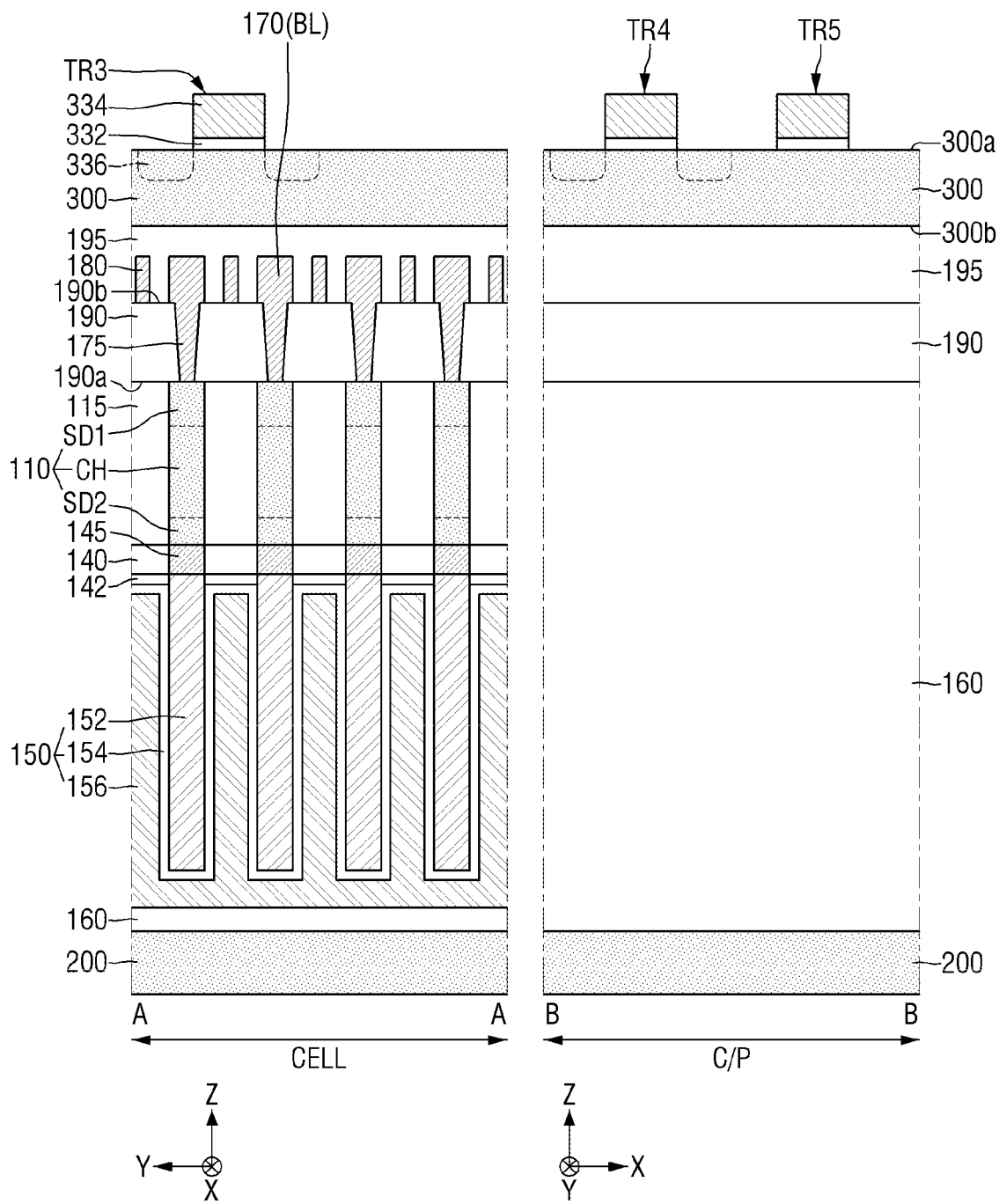

Referring to FIG. 28, a third circuit element TR3, a fourth circuit element TR4, and a fifth circuit element TR5 are formed. The third circuit element TR3, the fourth circuit element TR4 and the fifth circuit element TR5 may be formed to be similar to those described with reference to FIG. 22, further detailed description will be omitted.

Subsequently, referring to FIG. 10, a second through via 346, wiring structures 342 and 344, and a second rear insulating layer 390 are formed. As a result, the semiconductor memory device described with reference to FIG. 10 may be fabricated.

While the present inventive concept has been particularly shown and described with reference to example embodiments thereof, it will be understood by those of ordinary skill in the art that various changes in form and details may be made therein without departing from the scope of the present inventive concept as defined by the following claims. It is therefore desired that the example embodiments be considered in all respects as illustrative and not restrictive, reference being made to the appended claims rather than the foregoing description to indicate the scope of the invention.

What is claimed is:

1. A semiconductor memory device comprising:
   a cell area and a peripheral area adjacent the cell area;
   a base insulating layer comprising a first front surface and a first rear surface, which are opposite to each other, in the cell area;
   a first semiconductor substrate comprising a second front surface and a second rear surface, which are opposite to each other, in the peripheral area;
   an active pattern on the first front surface of the base insulating layer;
   a first conductive line extending in a first direction on a side of the active pattern;
   a capacitor structure on the active pattern opposite the base insulating layer;
   a first circuit element on the second front surface of the first semiconductor substrate; and
   a second conductive line extending in a second direction intersecting the first direction on the first rear surface of the base insulating layer and the second rear surface of the first semiconductor substrate,
   wherein the active pattern extends in a vertical direction intersecting the first direction and the second direction to electrically connect the second conductive line to the capacitor structure.

2. The semiconductor memory device of claim 1, further comprising a bit line contact extending through the base insulating layer to electrically connect the active pattern to the second conductive line, wherein the second conductive line is a bit line.

3. The semiconductor memory device of claim 2, wherein a width of the bit line contact is reduced as the bit line contact extends toward the active pattern.

4. The semiconductor memory device of claim 1, further comprising a shielding line spaced apart from a side of the second conductive line on the first rear surface of the base insulating layer and extending in the second direction.

5. The semiconductor memory device of claim 1, wherein the second conductive line is a bit line, and the first circuit element comprises a sense amplifier electrically connected to the second conductive line.

6. The semiconductor memory device of claim 1, further comprising:
a third semiconductor substrate comprising a third rear surface facing the first rear surface of the base insulating layer and the second rear surface of the first semiconductor substrate, and a third front surface opposite to the third rear surface; and
a second circuit element on the third front surface of the third semiconductor substrate.

7. The semiconductor memory device of claim 6, further comprising a bonding interface between the third rear surface of the third semiconductor substrate and the first rear surface of the base insulating layer.

8. The semiconductor memory device of claim 1, wherein each of the active pattern and the first semiconductor substrate comprises a single crystal semiconductor material.

9. A semiconductor memory device comprising:
an insulating structure comprising a first surface and a second surface, which are opposite to each other;
an active pattern on the first surface of the insulating structure;
a first conductive line extending in a first direction on a side of the active pattern;
a capacitor structure on the active pattern opposite the insulating structure;
a second conductive line extending in a second direction intersecting the first direction in the insulating structure;
a first semiconductor substrate comprising a first rear surface facing the second surface of the insulating structure and a first front surface opposite to the first rear surface; and
a first circuit element on the first front surface of the first semiconductor substrate,
wherein the active pattern extends in a vertical direction intersecting the first direction and the second direction to electrically connect the second conductive line to the capacitor structure.

10. The semiconductor memory device of claim 9, wherein the second conductive line is a bit line, and the first circuit element comprises a sense amplifier electrically connected to the second conductive line.

11. The semiconductor memory device of claim 9, further comprising:
a second semiconductor substrate comprising a second front surface and a second rear surface, which are opposite to each other; and
a second circuit element on the second front surface of the second semiconductor substrate,
wherein the second conductive line is on the second rear surface of the second semiconductor substrate.

12. The semiconductor memory device of claim 9, wherein the semiconductor memory device comprises a cell area and a peripheral area adjacent the cell area,
the active pattern is in the cell area, and
the first circuit element is in the peripheral area.

13. The semiconductor memory device of claim 12, further comprising:
a second circuit element on the first front surface of the first semiconductor substrate, wherein the second circuit element is in the cell area; and
a bonding interface between the first rear surface of the first semiconductor substrate and the second surface of the insulating structure.

14. The semiconductor memory device of claim 13, wherein the second conductive line is a bit line, and the second circuit element comprises a sense amplifier electrically connected to the second conductive line.

15. The semiconductor memory device of claim 9, wherein the active pattern comprises a single crystal semiconductor material.

16. The semiconductor memory device of claim 9, further comprising a shielding line spaced apart from a side of the second conductive line in the insulating structure and extending in the second direction.

17. A semiconductor memory device comprising:
a base insulating layer comprising a first front surface and a first rear surface, which are opposite to each other;
an active pattern on the first front surface of the base insulating layer;
a first conductive line extending in a first direction on a side of the active pattern;
a capacitor structure on the active pattern opposite the base insulating layer;
a plurality of second conductive lines spaced apart from each other on the first rear surface of the base insulating layer and extending in parallel in a second direction intersecting the first direction;
a bit line contact extending through the base insulating layer to electrically connect one of the second conductive lines to the active pattern; and
a shielding line between two adjacent second conductive lines among the plurality of second conductive lines on the first rear surface of the base insulating layer,
wherein the active pattern extends in a vertical direction intersecting the first direction and the second direction to electrically connect the bit line contact to the capacitor structure.

18. The semiconductor memory device of claim 17, wherein the shielding line does not overlap the active pattern in the vertical direction.

19. The semiconductor memory device of claim 17, wherein the shielding line comprises a same material as that of the plurality of second conductive lines.

20. The semiconductor memory device of claim 17, wherein a width of the bit line contact is reduced as the bit line contact extends toward the active pattern.

* * * * *